(12) United States Patent
Yagi et al.

(10) Patent No.: US 11,910,553 B2
(45) Date of Patent: Feb. 20, 2024

(54) HEAT-DISSIPATING WATERPROOF STRUCTURE

(71) Applicant: NEC Platforms, Ltd., Kawasaki (JP)

(72) Inventors: Takahiro Yagi, Kanagawa (JP); Kiyotaka Yokoyama, Kanagawa (JP); Akira Katsumata, Kanagawa (JP); Wataru Imura, Kanagawa (JP)

(73) Assignee: NEC Platforms, Ltd., Kanagawa (JP)

( * ) Notice: Subject to any disclaimer, the term of this patent is extended or adjusted under 35 U.S.C. 154(b) by 695 days.

(21) Appl. No.: 16/964,858

(22) PCT Filed: Nov. 30, 2018

(86) PCT No.: PCT/JP2018/044141
§ 371 (c)(1),
(2) Date: Jul. 24, 2020

(87) PCT Pub. No.: WO2019/150742
PCT Pub. Date: Aug. 8, 2019

(65) Prior Publication Data
US 2021/0068286 A1    Mar. 4, 2021

(30) Foreign Application Priority Data
Jan. 31, 2018  (JP) .................................. 2018-015630

(51) Int. Cl.
*H05K 5/06*    (2006.01)
*H05K 7/20*    (2006.01)
*F28F 3/12*    (2006.01)

(52) U.S. Cl.
CPC ............... *H05K 5/069* (2013.01); *F28F 3/12* (2013.01); *H05K 7/20409* (2013.01)

(58) Field of Classification Search
CPC ............ H05K 7/2049; H05K 7/20918; H05K 7/1427; H05K 7/20009; H05K 7/20145; H05K 7/20409; H05K 5/0213
See application file for complete search history.

(56) References Cited

U.S. PATENT DOCUMENTS 5,649,859 A * 7/1997 Shiga ..................... H02G 3/088
454/275
7,843,684 B2   11/2010 Lu et al.
(Continued)

FOREIGN PATENT DOCUMENTS

| CN | 101400244 A | 4/2009 |
| CN | 102749961 A | 10/2012 |

(Continued)

OTHER PUBLICATIONS

Chinese Office Action for CN Application No. 201880088175.9 dated Dec. 18, 2020 with English Translation.

(Continued)

*Primary Examiner* — Tho V Duong

(57) ABSTRACT

Provided is a heat-dissipating waterproof structure having both excellent heat dissipation ability and high waterproofness. A heat-dissipating waterproof structure (300) provided between a top part (203) of a casing (200) to accommodate a heat source (102) and the heat source (102) includes a water receiving part (301) that guides a liquid having entered into the casing (200) through an outlet (203A) provided in the top part (203) of the casing (200), and a water guide channel (302) that guides the liquid having been guided by the water receiving part (301) to be discharged to outside of a space where the heat source (102) is accommodated, and the water receiving part (301) has at least a sloping surface which gradually becomes higher the further it is from being immediately above the heat source (102).

6 Claims, 21 Drawing Sheets

(56) References Cited

U.S. PATENT DOCUMENTS

| | | | |
|---|---|---|---|
| 2008/0101041 A1* | 5/2008 | Chang | H05K 7/209 361/728 |
| 2010/0181108 A1* | 7/2010 | Hata | H05K 5/0213 174/548 |
| 2016/0255738 A1 | 9/2016 | Lin et al. | |
| 2017/0339801 A1 | 11/2017 | Sasaki | |
| 2018/0192533 A1* | 7/2018 | Yokozeki | H05K 5/0213 |
| 2019/0345159 A1* | 11/2019 | Goldstein | A61P 35/00 |

FOREIGN PATENT DOCUMENTS

| | | |
|---|---|---|
| CN | 203193780 U | 9/2013 |
| CN | 204067946 U | 12/2014 |
| CN | 107135628 A | 9/2017 |
| CN | 107535070 A | 1/2018 |
| CN | 109315073 A | 2/2019 |
| JP | S61-260689 A | 11/1986 |
| JP | S61-260698 A | 11/1986 |
| JP | H05-75275 A | 3/1993 |
| JP | H06-82884 U | 11/1994 |
| JP | H06-327121 A | 11/1994 |
| JP | H09-260787 A | 10/1997 |
| JP | H109-260878 A | 10/1997 |
| JP | H09-307247 A | 11/1997 |
| JP | H11-330748 A | 11/1999 |
| JP | 2002-203456 A | 7/2002 |
| JP | 2005-079295 A | 3/2005 |
| JP | 2007-235055 A | 9/2007 |
| JP | 2017-208476 A | 11/2017 |
| JP | 2019-009165 A | 1/2019 |
| WO | 2013/046261 A1 | 4/2013 |
| WO | 2015/192423 A1 | 12/2015 |

OTHER PUBLICATIONS

International Search Report for PCT Application No. PCT/JP2018/044141, dated Feb. 12, 2019.

Japanese Office Action for JP Application No. 2018-015630 dated Feb. 5, 2019 with English Translation.

Japanese Office Action for JP Application No. 2018-015630 dated Jul. 16, 2019 with English Translation.

Chinese Office Action for CN Application No. 201880088175.9 dated May 31, 2021 with English Translation.

Japanese Office Action for JP Application No. 2019-165193 dated Sep. 29, 2020 with English Translation.

Chinese Office Action for CN Application No. 202110474814.9 dated Mar. 3, 2022 with English Translation.

* cited by examiner

HEAT-DISSIPATING WATERPROOF STRUCTURE

This application is a National Stage Entry of PCT/JP2018/044141 filed on Nov. 30, 2018, which claims priority from Japanese Patent Application 2018-015630 filed on Jan. 31, 2018, the contents of all of which are incorporated herein by reference, in their entirety.

TECHNICAL FIELD

The present invention relates to a heat-dissipating waterproof structure of a casing for accommodating a heat source.

BACKGROUND ART

A device in which a heat source is inside a casing includes a heat-dissipating structure in order to suppress the temperature of parts and an area where a temperature higher than a certain degree is not allowed, such as the heat source or its peripheral parts. This heat-dissipating structure dissipates heat of a heat generation part such as a heat source to the air inside the casing by convective heat transfer. To be specific, this heat-dissipating structure reduces the temperature of an area where the temperature needs to be suppressed through a part that enhances heat dissipation efficiency such as a heatsink, through a part that spreads or adjusts a heat dissipation path, or directly.

The heat of the air inside the casing received from the heat source and having reached high temperature is dissipated to the inner surface of the casing shell by convective heat transfer. The heat of the casing shell received from the air inside the casing is dissipated from the surface of the casing shell to the air outside the casing by heat conduction in the casing shell.

Further, a typical way to further reduce the temperature of an area where the temperature needs to be suppressed is to add a heat transfer path that allows air transfer by making a vent in the casing shell for ventilation. In such natural air cooling, an airflow where air is drawn in through a hole located lower than a heat source in the direction of gravitational force, receives heat from the heat source, and is exhausted through a hole located higher than the heat source in the direction of gravitational force is formed. Thus, enhancement of the heat dissipation by such a convective flow to increase the efficiency can be achieved by increasing the amount of air inflow and outflow. In other words, the amount of heat dissipation to the air outside the casing increases as the number of holes and the size of holes are greater.

On the other hand, there is a problem that a hole, not limited to a vent, made in the casing shell can be a path through which a liquid enters into the casing. As the size of holes and the number of holes are greater, a liquid enters more easily. Objects that should especially avoid contact with a liquid include electrical parts such as substrates that are at risk of short-circuit, and they are a heat source. Thus, if a cover, a shield or the like that avoids contact of electrical parts with a liquid is provided, they particularly inhibit the airflow and heat dissipation in close proximity to the heat source, which causes a decrease in heat dissipation efficiency. Therefore, it has been difficult in principle to achieve both heat dissipation and waterproof at high levels.

Patent Literature 1 discloses a casing composed of a casing body that incorporates a communication unit and a door that covers the opening of this casing body. Further, Patent Literature 1 describes that a rain visor, which is a plate-like member, is placed on the upper side of the front face of the casing body so as to prevent rainwater pouring on the casing body from flowing to the opening of the casing body. Patent Literature 1 also describes that an upper plate is placed below the ceiling of the casing body in such a way that it covers the communication unit. Patent Literature 1 further describes that the upper plate is provided with a drain pipe, so that rainwater accumulated in the upper plate flows through the drain pipe and is discharged to the outside of the casing.

CITATION LIST

Patent Literature

PTL1: Japanese Unexamined Patent Application Publication No. H05-075275

SUMMARY OF INVENTION

Technical Problem

Patent Literature 1 does not describe or even suggest the dissipation of heat released from a heat source such as electronic equipment. Therefore, Patent Literature 1 does not attain a structure that achieves both heat dissipation and waterproof.

An object of the present invention is to provide a heat-dissipating waterproof structure having both excellent heat dissipation ability and high waterproofness.

Solution to Problem

A heat-dissipating waterproof structure according to a first aspect of the present invention is a heat-dissipating waterproof structure provided between a top part of a casing to accommodate a heat source and the heat source, including a slope part that guides a liquid having entered into the casing through an outlet provided in at least one of an upper part of a side part of the casing and the top part, and a discharge part that guides the liquid having been guided by the slope part to be discharged to outside of a space where the heat source is accommodated, wherein the slope part has at least a sloping surface which gradually becomes higher the further it is from being immediately above the heat source.

Advantageous Effects of Invention

It is possible to provide a heat-dissipating waterproof structure having both excellent heat dissipation ability and high waterproofness.

DESCRIPTION OF EMBODIMENTS

First Embodiment

Figure 1:
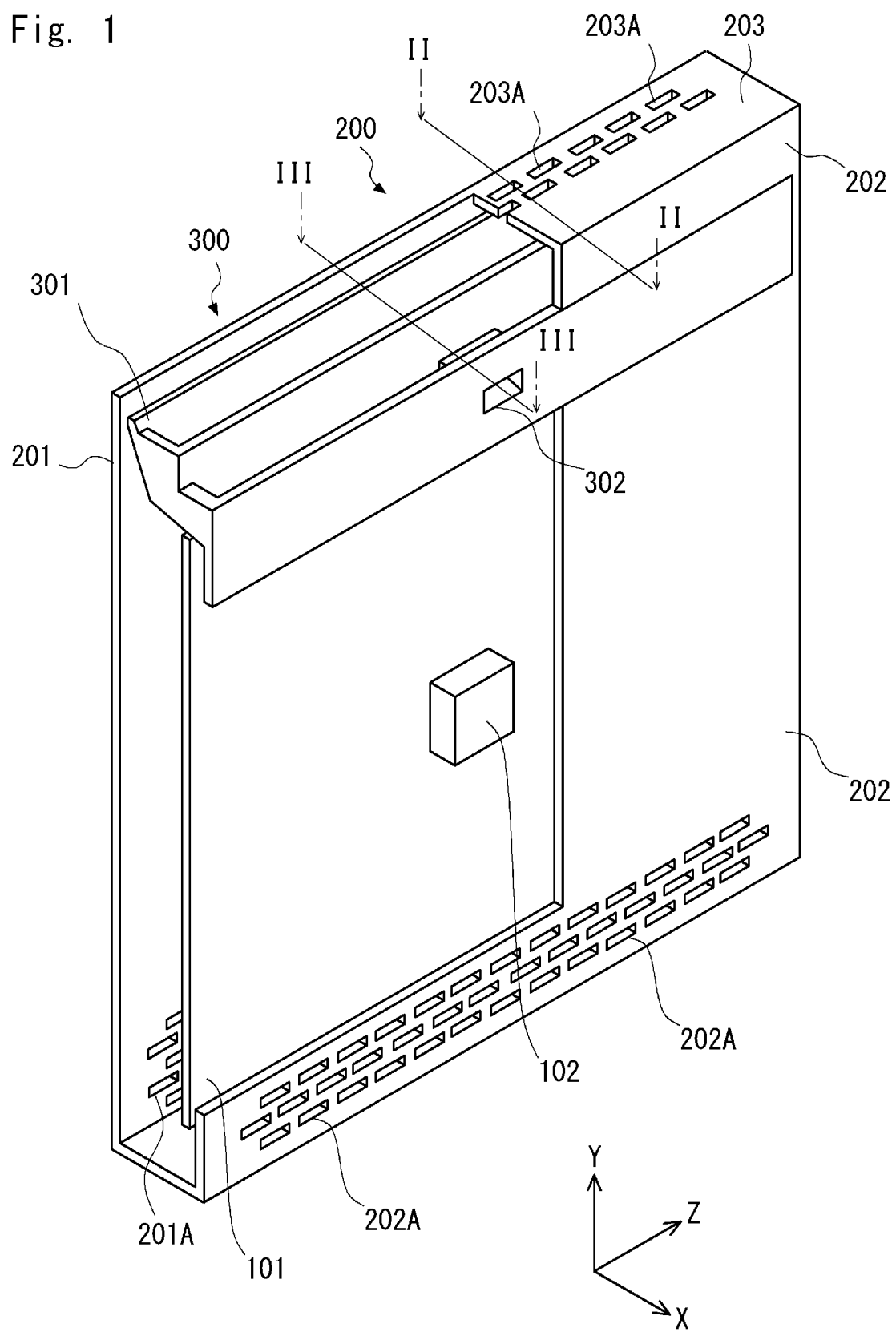
FIG. 1 is a perspective view showing a casing having a heat-dissipating waterproof structure according to a first embodiment.
Figure 2:
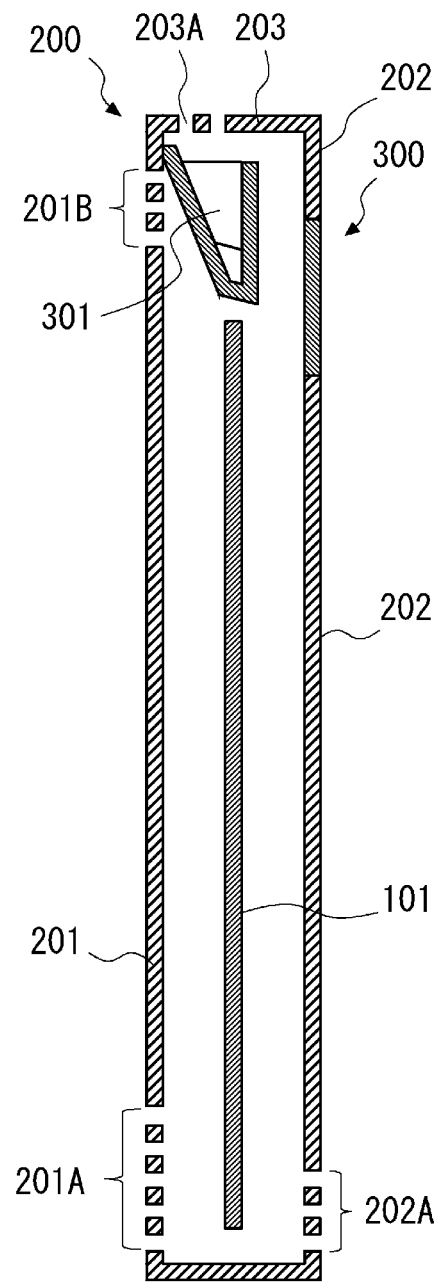
FIG. 2 is a cross-sectional view showing the casing having the heat-dissipating waterproof structure according to the first embodiment.
Figure 2:
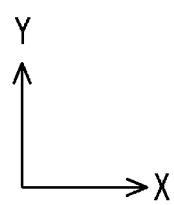
Figure 3:
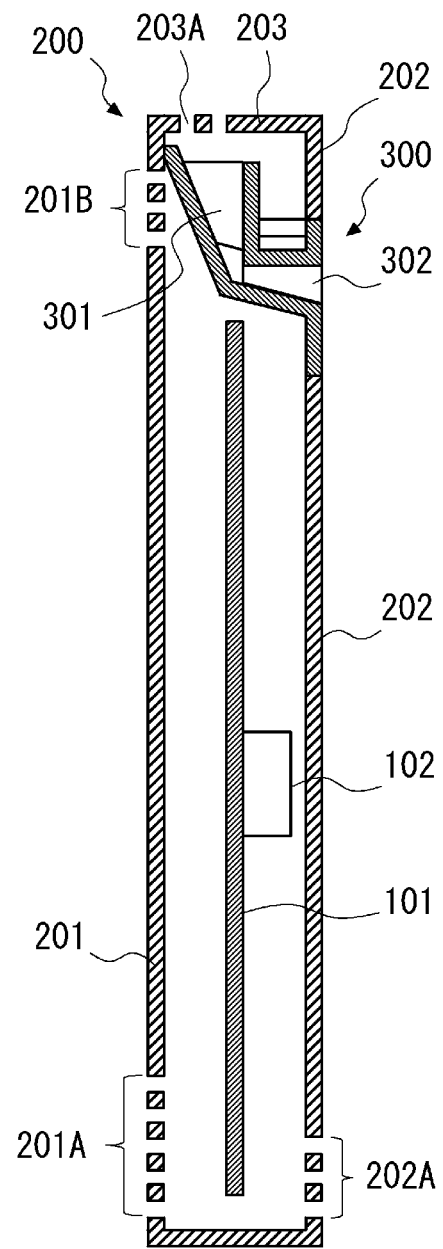
FIG. 3 is a cross-sectional view showing the casing having the heat-dissipating waterproof structure according to the first embodiment.
Figure 3:
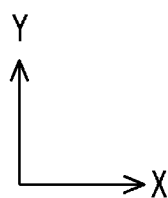

Embodiments of the present invention are described hereinafter with reference to the drawings. FIG. 1 is a perspective view showing a casing 200 having a heat-dissipating waterproof structure 300 according to a first embodiment of the present invention. In FIG. 1, the casing 200 is partially cut, and the internal structure of the casing 200 is partially shown. FIGS. 2 and 3 are cross-sectional views showing the casing 200 that includes the heat-dissipating waterproof structure 300 according to the first embodiment. Specifically, FIG. 2 is a cross-sectional view along line II-II in FIG. 1, and FIG. 3 is a cross-sectional view along line in FIG. 1. In this specification, the x-axis direction is the horizontal direction of the casing 200, the y-axis direction is the vertical direction of the casing 200, and the z-axis direction is the longitudinal direction of the casing 200.

As shown in FIG. 1, the casing 200 accommodates a substrate 101 on which a heat source 102 is mounted. The heat source 102 is a part that is placed inside the casing 200 and produces heat, and it may be an electronic component mounted on the substrate 101, a device such as a motor or the like, for example. An example of the heat source 102 described in this specification is one that is mounted on the substrate 101. Although an example where one heat source 102 exists in the casing 200 is described in this specification for simplification of description, a plurality of heat sources 102 may be accommodated in the casing 200. Further, in this specification, the substrate 101 and the heat source 102 are defined as objects that should avoid contact with a liquid. The substrate 101 is accommodated inside the casing 200 in such a way that it is substantially parallel to the y-z plane. The heat source 102 is mounted on the surface of the substrate 101 closer to the side part 202 (which is described later).

The casing 200 is generally composed of a plurality of parts, and the casing 200 is produced by assembling the plurality of parts. In the first embodiment, however, it is assumed that the casing 200 is produced in a single piece for simplification of description. Further, the casing 200 has a plurality of inlets and outlets in order to dissipate heat inside the casing 200. To be specific, the casing 200 has a plurality of inlets 201A in a lower part of its side part 201. The casing 200 also has a plurality of outlets 201B in an upper part of the side part 201. Further, the casing 200 has a plurality of inlets 202A in a lower part of its side part 202 which is opposite the side part 201. The casing 200 also has a plurality of outlets 203A in its top part 203. Note that the side part 201 and the side part 202 are parallel to the y-z plane, and the top part 203 is parallel to the x-z plane. Further, the side part 201 is a left (the negative side of the x-axis) side part, and the side part 202 is a right (the positive side of the x-axis) side part.

The heat-dissipating waterproof structure 300 is placed between the top part 203 of the casing 200 and the heat source 102. As shown in FIG. 3, the heat-dissipating waterproof structure 300 includes a water receiving part 301 that serves as a slope part and a water guide channel 302 that serves as a discharge part. The heat-dissipating waterproof structure 300 may be integrated with the casing 200.

The water receiving part 301 guides a liquid that has entered into the casing 200 through the plurality of outlets 203A provided in the top part 203. In the examples shown in FIGS. 2 and 3, the water receiving part 301 guides a liquid having entered into the casing 200 through the plurality of outlets 203A in the top part 203. To be specific, the bottom surface of the water receiving part 301 slopes down toward the water guide channel 302. In other words, the bottom surface of the water receiving part 301 is tilted in the negative direction of the y-axis as it goes in the positive direction of the x-axis. The water receiving part 301 thereby guides a liquid having entered into the casing 200 through the outlets 203A toward the water guide channel 302. To be more specific, the bottom surface of the water receiving part 301 is a sloping surface that gradually becomes higher as it is away from immediately above the heat source 102. In other words, the y-z cross section of the bottom surface of the water receiving part 301 is substantially V-shaped, and the water receiving part 301 communicates with the water guide channel 302 at the apex of this V shape. Note that the water receiving part 301 may guide a liquid that has entered into the casing 200 through the plurality of outlets 201B provided in the upper part of the side part 201.

The water guide channel 302 guides the liquid that has been guided by the water receiving part 301 so as to discharge the liquid to the outside of the space in which the heat source 102 is accommodated. To be specific, the water guide channel 302 is a flow path that extends from the apex of the V shape of the water receiving part 301 to the side part 202 along the x-axis and has a discharge port passing through the side part 202. Specifically, the water guide channel 302 discharges the liquid that has been guided by the water receiving part 301 to the outside of the space surrounded by the side part 201, the side part 202, the top part 203 and the bottom part, in which the heat source 102 is accommodated.

In the casing 200, heat from the heat source 102 transfers to the substrate 101 by heat conduction, and the substrate 101 is thereby warmed up. Further, as a result that the air in the casing 200 is warmed up by the heat source 102 and the warmed substrate 101, natural convection occurs in the casing 200, and consequently the upper part of the casing 200 has high temperature and the lower part has low temperature. Further, the air drawn in the casing 200 through the plurality of inlets 201A at the lower part of the side part 201 and the plurality of inlets 202A at the lower part of the side part 202 is also warmed up by receiving heat from the heat source 102 and the warmed substrate 101. Then, the air warmed mainly by the heat source 102 dissipates heat internally in the casing 200 or the like by convective heat transfer and also rises by buoyancy until it reaches the bottom surface of the water receiving part 301 of the heat-dissipating waterproof structure 300. Because the bottom surface of the water receiving part 301 is sloping, the rising air hits against this bottom surface and loses its momentum, and is thereby diffused along the slope of this bottom surface. To be specific, the air spreads from the apex to the end of the V shape of the bottom surface of the water receiving part 301. Thus, it is possible to guide the warmed air to the end of the bottom surface, which is located away from the heat source 102 and thus should be low temperature. This allows the temperature of the air in the upper part in the casing 200 to be equalized to some extent, which suppresses the occurrence of a local high temperature region in the casing 200 due to the location of the heat source 102 or the like. The air that has spread along the bottom surface of the water receiving part 301 rises further upward in the casing 200, and is exhausted to the outside of the casing 200 through the plurality of outlets 201B provided in the upper part of the side part 201 and the plurality of outlets 203A provided in the top part 203. By this flow of the air, the heat of the heat source 102 in the casing 200 is dissipated.

Note that, as shown in FIG. 2, the space next to the water receiving part 301 on the side of the side part 202 in the heat-dissipating waterproof structure 300 communicates with the space between the substrate 101 and the side part 202 except for the water guide channel 302. Thus, the air between the substrate 101 and the side part 202 rises by being warmed by the heat source 102, passes through the space next to the water receiving part 301 on the side of the side part 202 in the heat-dissipating waterproof structure 300, and then is exhausted to the outside of the casing 200 through the outlets 203A on the top part 203.

In the heat-dissipating waterproof structure 300 according to the first embodiment described above, the water receiving part 301 guides a liquid that has entered into the casing 200 through the plurality of outlets 203A on the top part 203 to the water guide channel 302, and the water guide channel 302 discharges the liquid that has been guided by the water receiving part 301 to the outside of the space in which the heat source 102 is accommodated. Further, because the bottom surface of the water receiving part 301 is a sloping surface that gradually becomes higher as it is away from immediately above the heat source 102, the air warmed by the heat source 102 and rising reaches the bottom surface of the water receiving part 301 and is then diffused along the slope of the bottom surface toward the end of the bottom surface. This allows the temperature of the air in the upper part in the casing 200 to be equalized to some extent, which suppresses the occurrence of a local high temperature region in the casing 200 due to the location of the heat source 102 or the like. It is thereby possible to provide the heat-dissipating waterproof structure 300 having both excellent heat dissipation ability and high waterproofness.

To be more specific, diffusing high temperature air as evenly as possible in the casing 200 allows an increase in the total amount of heat transfer to the casing 200 and also an increase in the total amount of heat dissipation to the air outside the casing 200. Further, in the case where the permissible temperature on the surface of the casing 200 is determined depending on a type of usage or for safety reasons, diffusing high temperature air as evenly as possible in the casing 200 allows achievement of a uniform temperature distribution without the occurrence of a local high temperature region on the surface of the casing 200.

Further, it is possible to simultaneously provide a waterproof structure that reduces the inflow of a liquid into a region where the heat source 102, the substrate 101 and so on are placed and a heat dissipation structure that can adjust the airflow (direction and velocity) and the amount of air inflow and outflow as appropriate in accordance with a temperature distribution required for the casing 200 without using a structure that causes a decrease in the amount of heat dissipation, such as an obstruction that reduces the number or size of discharge ports or a shield that blocks the flow of air.

The shape of the bottom surface of the water receiving part 301 and the number of water guide channels 302 may be altered as appropriate depending on the number and location of the heat sources 102 accommodated in the casing 200.

Second Embodiment

Figure 4:
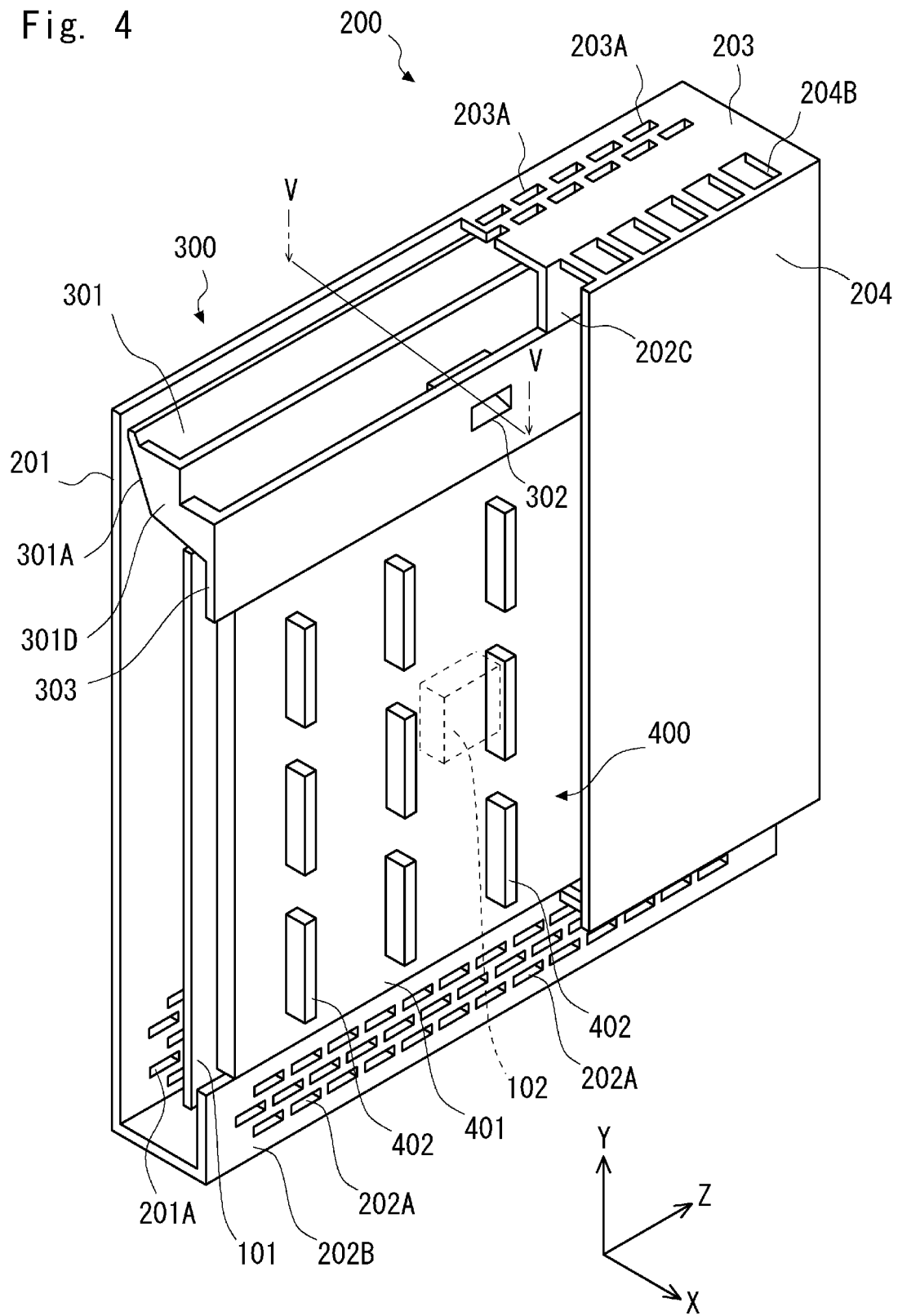
FIG. 4 is a perspective view showing a casing having a heat-dissipating waterproof structure according to a second embodiment.
Figure 5:
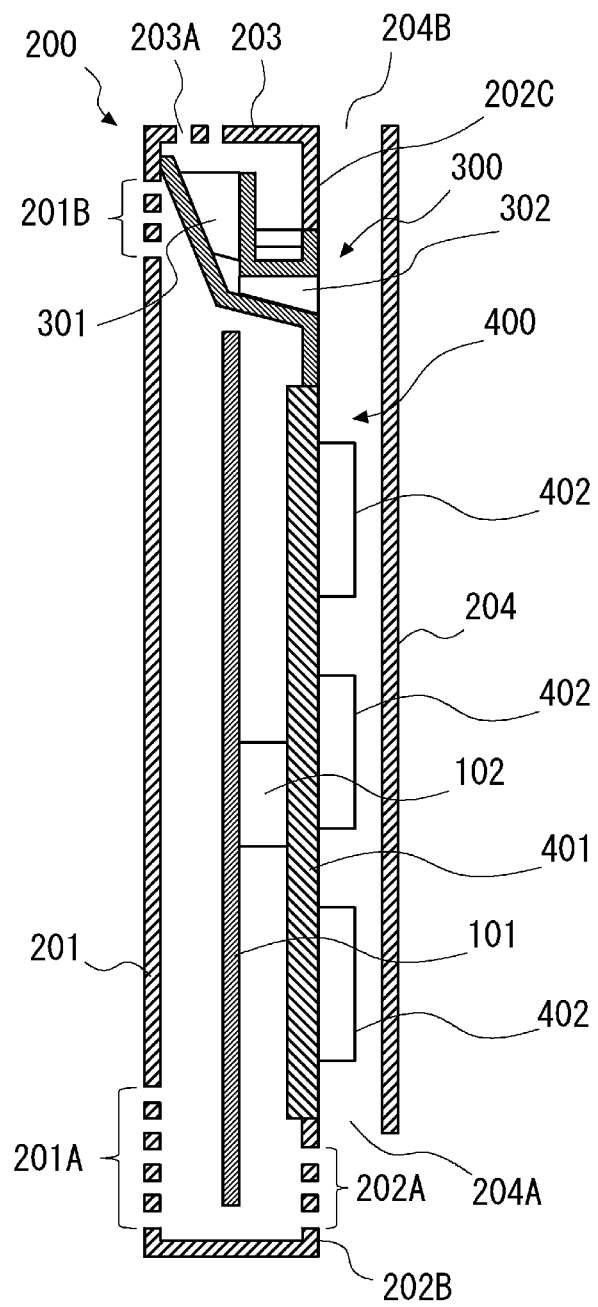
FIG. 5 is a cross-sectional view showing the casing having the heat-dissipating waterproof structure according to the second embodiment.
Figure 5:
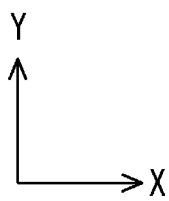
Figure 6:
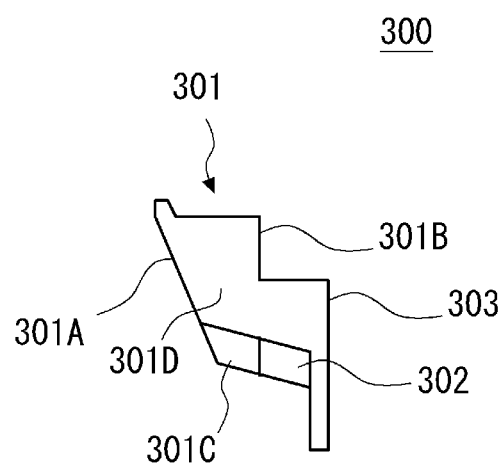
FIG. 6 is a front view showing the heat-dissipating waterproof structure according to the second embodiment.
Figure 6:
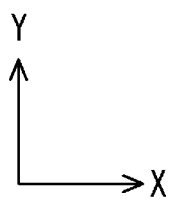
Figure 7:
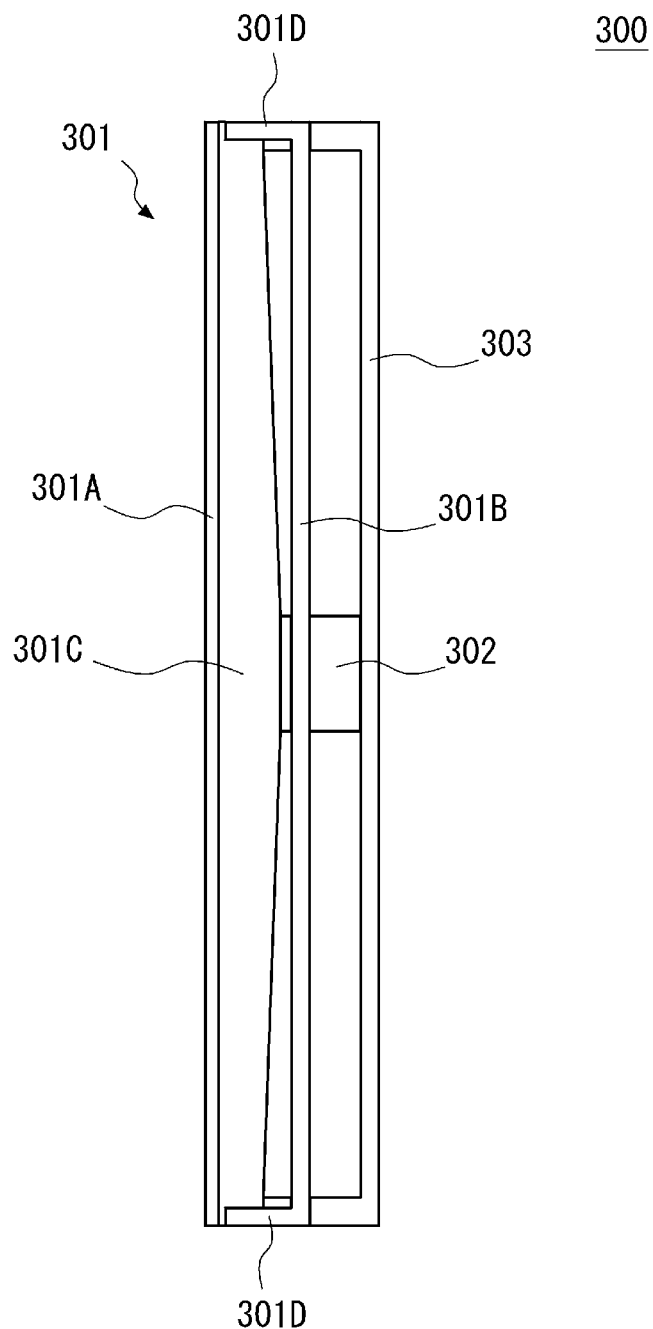
FIG. 7 is a plan view showing the heat-dissipating waterproof structure according to the second embodiment.
Figure 7:
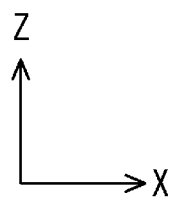
Figure 8:
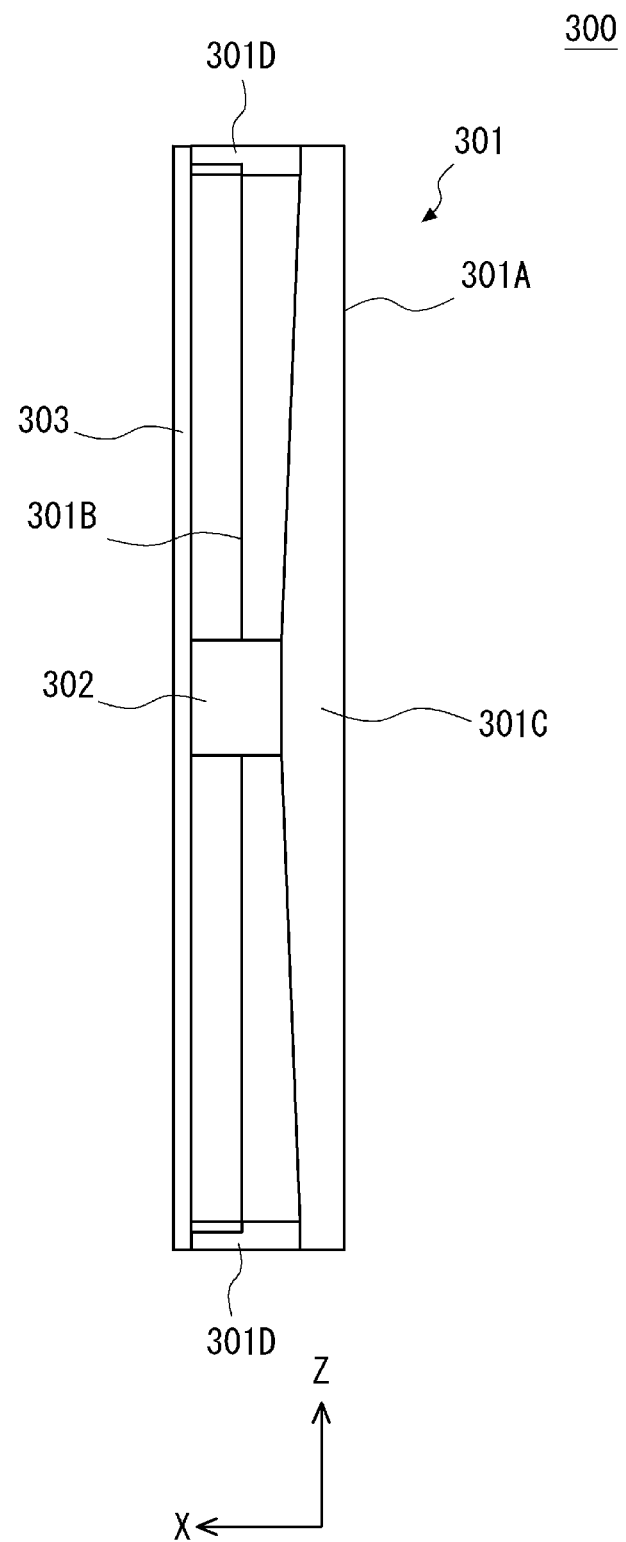
FIG. 8 is a bottom view showing the heat-dissipating waterproof structure according to the second embodiment.
Figure 9:
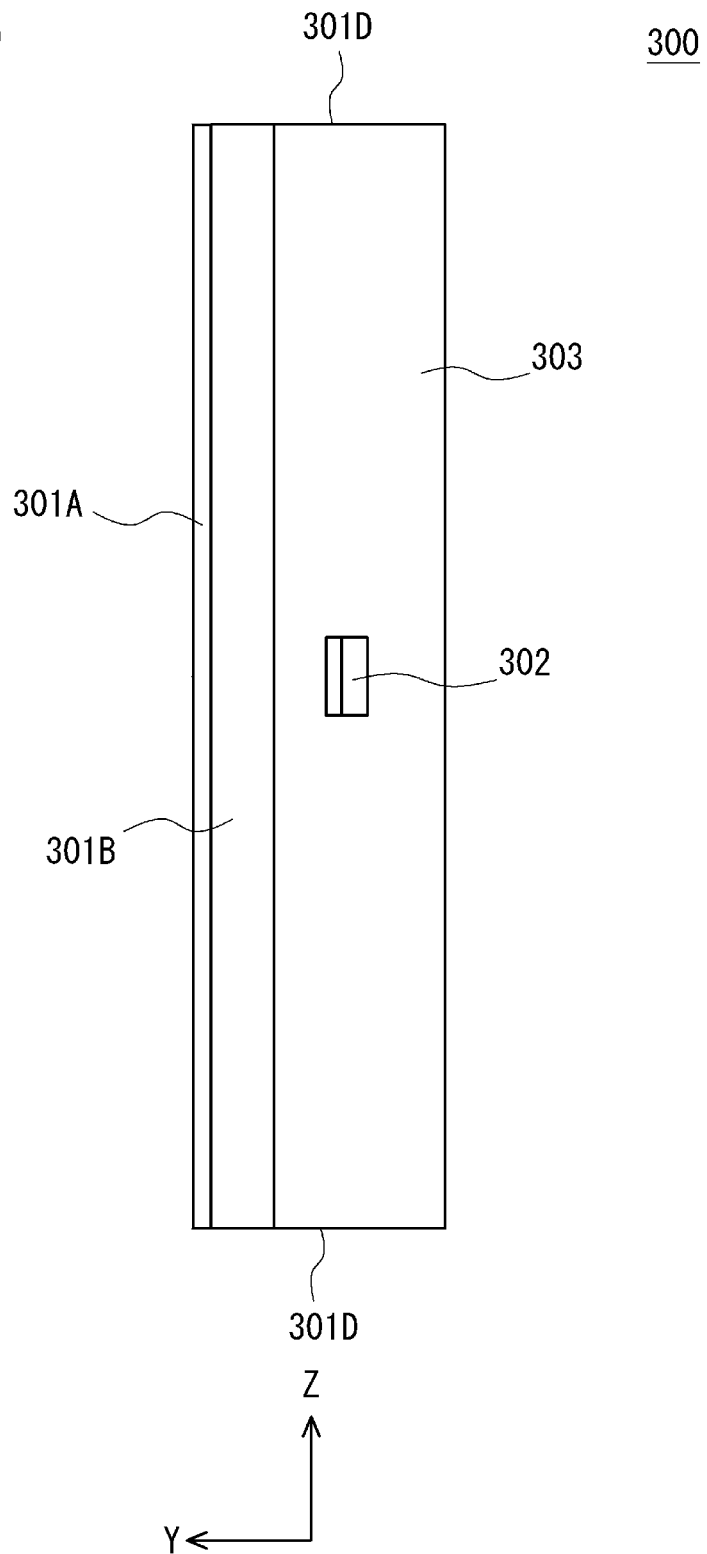
FIG. 9 is a side view showing the heat-dissipating waterproof structure according to the second embodiment.
Figure 10:
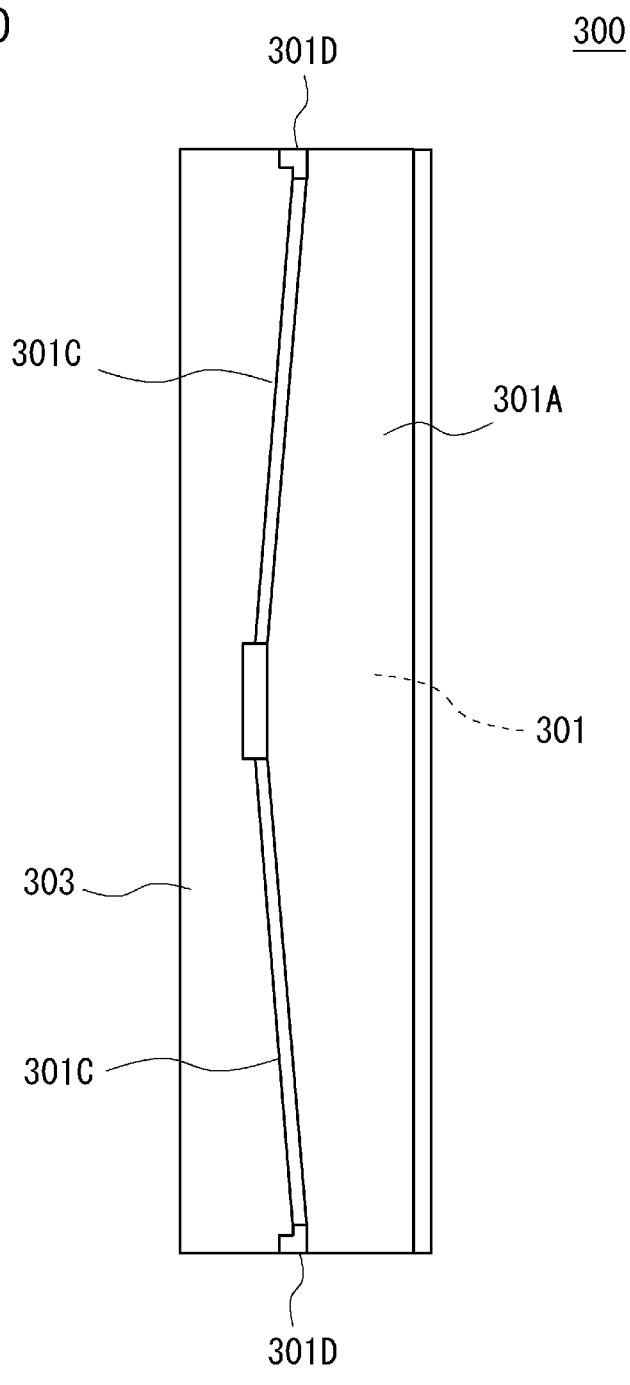
FIG. 10 is a side view showing the heat-dissipating waterproof structure according to the second embodiment.

A second embodiment of the present invention is described hereinafter with reference to FIGS. 4 to 10. FIG. 4 is a perspective view showing a casing 200 that includes a heat-dissipating waterproof structure 300 according to the second embodiment. In FIG. 4, the casing 200 is partially cut, and the internal structure of the casing 200 is partially shown. FIG. 5 is a cross-sectional view showing the casing 200 that includes the heat-dissipating waterproof structure 300 according to the second embodiment. Specifically, FIG. 5 is a cross-sectional view along line V-V in FIG. 4. FIG. 6 is a front view showing the heat-dissipating waterproof structure 300 according to the second embodiment. FIG. 7 is a plan view showing the heat-dissipating waterproof structure 300 according to the second embodiment. FIG. 8 is a bottom view showing the heat-dissipating waterproof structure 300 according to the second embodiment. FIG. 9 is a side view showing the heat-dissipating waterproof structure 300 according to the second embodiment. FIG. 10 is a side view showing the heat-dissipating waterproof structure 300 according to the second embodiment.

The casing 200 that includes the heat-dissipating waterproof structure 300 according to the second embodiment is different from the casing 200 that includes the heat-dissipating waterproof structure 300 according to the first embodiment in that it includes a heatsink-like part 400. Thus, the same elements are denoted by the same reference symbols and the description thereof is omitted.

As shown in FIG. 4, the casing 200 has a rectangular solid shape. To be specific, the casing 200 has a side part 201, a side part 202 and a side part 204 that are parallel to the y-z plane, two x-y side parts that are parallel to the x-y plane, and a top part 203 and a bottom part that are parallel to the x-z plane. The side part 201, the side part 202, the side part 204, the two x-y side parts, the top part 203 and the bottom part may be integrated.

The side part 201 stands on the left (on the negative side of the x-axis) of the bottom part. The side part 202 is divided into a lower side part 202B and an upper side part 202C. The lower side part 202B stands on the right (on the positive side of the x-axis) of the bottom part. The upper side part 202C hangs from the position on the right (on the positive side of the x-axis) of the middle of the widthwise of the top part 203. The heatsink-like part 400 (which is described later) is placed above the lower side part 202B. Further, the lower end of the upper side part 202C is in contact with the upper end of a wall part 303 (which is described later) of the heat-dissipating waterproof structure 300. The side part 201 hangs on the left (on the negative side of the x-axis) of the top part 203, and the side part 204 hangs on the right (on the positive side of the x-axis) of the top part 203. The side part 204 is placed on the right (on the positive side of the x-axis) of the side parts 202B and 202C. Thus, the width (the size along the x-axis) of the top part 203 is larger than the bottom part. The two x-y side parts are formed lying from the bottom part to the top part 203.

The top part 203 has a plurality of outlets 204B at its end part closer to the side part 204. Further, the lower end of the side part 204 bends toward the lower side part 202B and is substantially parallel to the x-z plane, and is joined with the side part 202B. The lower end of the side part 204 which is parallel to the x-z plane has a plurality of inlets 204A.

As shown in FIGS. 4 and 5, the heatsink-like part 400 has a structure in which a plurality of fins 402 stand on a plate 401. The heatsink-like part 400 stands on the lower side part 202B. To be specific, the heatsink-like part 400 is placed in such a way that the plate 401 and the substrate 101 are substantially parallel. In other words, the heatsink-like part 400 is placed in such a way that the plate 401 and the y-z plane are substantially parallel. Note that the heat source 102 is mounted on the surface of the substrate 101 closer to the heatsink-like part 400. Further, in this embodiment, the heat source 102 is in contact with the plate 401 of the heatsink-like part 400. Note that, however, a conductive sheet, grease or the like may be placed between the heat source 102 and the heatsink-like part 400. Further, the upper end of the plate 401 of the heatsink-like part 400 is in contact with the heat-dissipating waterproof structure 300. Thus, a space that is elongated vertically (in the y-axis direction) is formed between the heatsink-like part 400 and the side part 204. This space between the heatsink-like part 400 and the side part 204 is referred to hereinafter as "chimney space".

As shown in FIG. 5, heat from the heat source 102 transfers to the heatsink-like part 400 by heat conduction, and the heatsink-like part 400 is thereby warmed up. Further, as a result that the air in the chimney space is warmed up by the warmed heatsink-like part 400, natural convection occurs in the chimney space, and consequently the upper part of the chimney space has high temperature and the lower part has low temperature. Further, the air drawn in the chimney space through the plurality of inlets 204A at the lower part of the side part 204 is warmed up by receiving heat from the heatsink-like part 400. Then, the air warmed by the heatsink-like part 400 rises by so-called chimney effect (stack effect) and is exhausted to the outside of the chimney space through the plurality of outlets 204B on the top part 203. By this flow of the air, the heat transferred from the heat source 102 to the heatsink-like part 400 by heat conduction is dissipated.

The heat-dissipating waterproof structure 300 according to the second embodiment is described hereinafter with reference to FIGS. 6 to 10.

The heat-dissipating waterproof structure 300 includes a water receiving part 301 as a slope part, a water guide channel 302 as a discharge part, and a wall part 303 substantially parallel to the y-z plane. The heat-dissipating waterproof structure 300 may be integrated with the casing 200.

The water receiving part 301 is a container that can temporarily stores a predetermined amount of liquid that has entered into the casing 200 through the plurality of outlets 203A on the top part 203. To be specific, the water receiving part 301 has a side part 301A on the left side (on the negative side of the x-axis), a side part 301B on the right side (on the positive side of the x-axis), a bottom part 301C, and two side parts 301D substantially parallel to the x-y plane.

The upper end of the side part 301A of the water receiving part 301 is in contact with the inner surface of the side part 201 of the casing 200. Further, the upper end of the side part 301A is located upper than the plurality of outlets 201B provided in the upper part of the side part 201. The side part 301A slopes to the right (the positive side of the x-axis) as it goes downward (the negative side of the y-axis). In other words, the side part 301A slopes gradually toward the water guide channel 302 as it goes downward (the negative side of the y-axis).

The side part 301B of the water receiving part 301 is substantially parallel to the y-z plane, and it is located at the boundary between the water receiving part 301 and the water guide channel 302.

The bottom part 301C of the water receiving part 301 slopes down toward the water guide channel 302 (to the positive side of the x-axis). Further, as shown in FIGS. 7 and 8, the y-z cross section of the bottom part 301C is substantially V-shaped, and the water receiving part 301 communicates with the water guide channel 302 at the apex of this V shape. Specifically, the water receiving part 301 communicates with the water guide channel 302 at the lowest part of the bottom part 301C. The water receiving part 301 thereby guides a liquid that has entered into the casing 200 through the outlets 203A toward the water guide channel 302.

Further, because the y-z cross section of the bottom part 301C is substantially V-shaped, the lower surface of the bottom part 301C of the water receiving part 301 is a sloping surface that gradually becomes higher as it is away from immediately above the heat source 102.

The side part 301D of the water receiving part 301 is substantially parallel to the x-y plane, and it extends from the side part 301A to the wall part 303.

The water guide channel 302 is a flow path that extends from the side surface 301B of the water receiving part 301 to the wall part 303 at the apex of the V shape of the bottom part 301C of the water receiving part 301. The entrance of the water guide channel 302 is a through-hole located at the position corresponding to the apex of the V shape of the bottom part 301C of the side part 301B, and the exit of the water guide channel 302 is a through-hole located on the wall part 303. Thus, the water guide channel 302 is a flow path that connects the water receiving part 301 with the outside of the space in which the heat source 102 is accommodated at the lowest part of the sloping surface of the bottom part 301C of the water receiving part 301.

The bottom surface of the water guide channel 302 slopes down toward the wall part 303 (to the positive side of the x-axis). To be specific, the bottom surface of the water guide channel 302 has substantially the same slope as the bottom part 301C of the water receiving part 301.

The space surrounded by the side part 301B, the side part 301D and the wall part 303 communicates with the space between the substrate 101 and the heatsink-like part 400 except for the water guide channel 302. Thus, the air between the substrate 101 and the heatsink-like part 400 rises by being warmed by the heat source 102, passes through the space surrounded by the side part 301B, the side part 301D and the wall part 303, and is then exhausted to the outside of the casing 200 through the outlets 203A on the top part 203.

The wall part 303 is substantially parallel to the y-z plane, and it is located on the right (the positive side of the x-axis) of the side part 301B. To be specific, the wall part 303 is located at the exit position of the water guide channel 302. Further, the wall part 303 extends along the z-axis across the two side parts 301D. The wall part 303 also extends downward to the upper end of the heatsink-like part 400. Thus, the lower end of the wall part 303 is in contact with the upper end of the heatsink-like part 400. Further, the upper end of the wall part 303 is in contact with the lower end of the upper side part 202C. The chimney space between the heatsink-like part 400 and the side part 204 is thereby separated from the space in which the heat source 102 is accommodated. The space in which the heat source 102 is accommodated is the space surrounded by the bottom part of the casing 200, the side part 201, the top part 203, the side parts 202B and 202C, the heatsink-like part 400, and the heat-dissipating waterproof structure 300.

In the heat-dissipating waterproof structure 300 according to the second embodiment described above, the water receiving part 301 guides a liquid that has entered into the casing 200 through the plurality of outlets 203A on the top part 203 to the water guide channel 302, and the water guide channel 302 discharges the liquid that has been guided by the water receiving part 301 to the outside of the space in which the heat source 102 is accommodated. Further, because the bottom part 301C of the water receiving part 301 is a sloping surface that gradually becomes higher as it is away from immediately above the heat source 102, the air warmed by the heat source 102 and rising reaches the bottom part 301C and is then diffused along the slope of the bottom part 301C toward the end of the bottom part 301C. This allows the temperature of the air in the upper part in the casing 200 to be equalized to some extent, which suppresses the occurrence of a local high temperature region in the casing 200 due to the location of the heat source 102 or the like. It is thereby possible to provide the heat-dissipating waterproof structure 300 having both excellent heat dissipation ability and high waterproofness.

Further, the water receiving part 301 is a container that can temporarily stores a predetermined amount of liquid that has entered into the casing 200 through the plurality of outlets 203A on the top part 203. Therefore, even when a large amount of liquid enters into the casing 200 through the outlets 203A, it is possible to temporarily store this liquid in the water receiving part 301, and discharge this liquid to the outside of the space in which the heat source 102 is accommodated from the water guide channel 302.

Furthermore, the upper end of the side part 301A of the water receiving part 301 is in contact with the inner surface of the side part 201 of the casing 200. Therefore, the heat-dissipating waterproof structure 300 reliably prevents a liquid that has entered into the casing 200 through the plurality of outlets 203A on the top part 203 from entering into the space in which the heat source 102 is accommodated.

In addition, the bottom surface of the water guide channel 302 slopes down toward the wall part 303 (to the positive side of the x-axis). This inhibits a liquid from building up in the water guide channel 302, which allows the water guide channel 302 to smoothly discharge the liquid.

Figure 11:
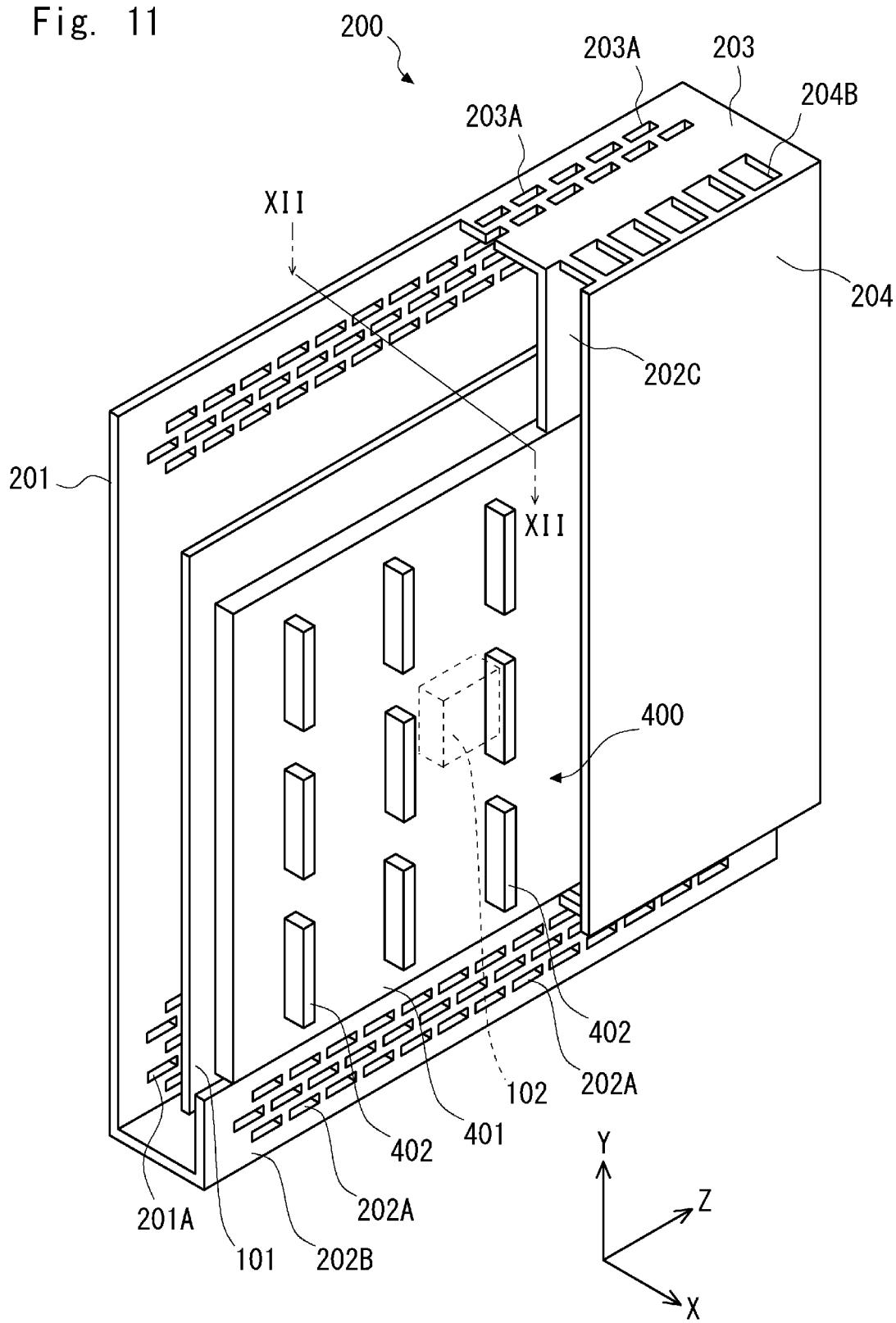
FIG. 11 is a perspective view showing a casing according to a comparative example.
Figure 12:
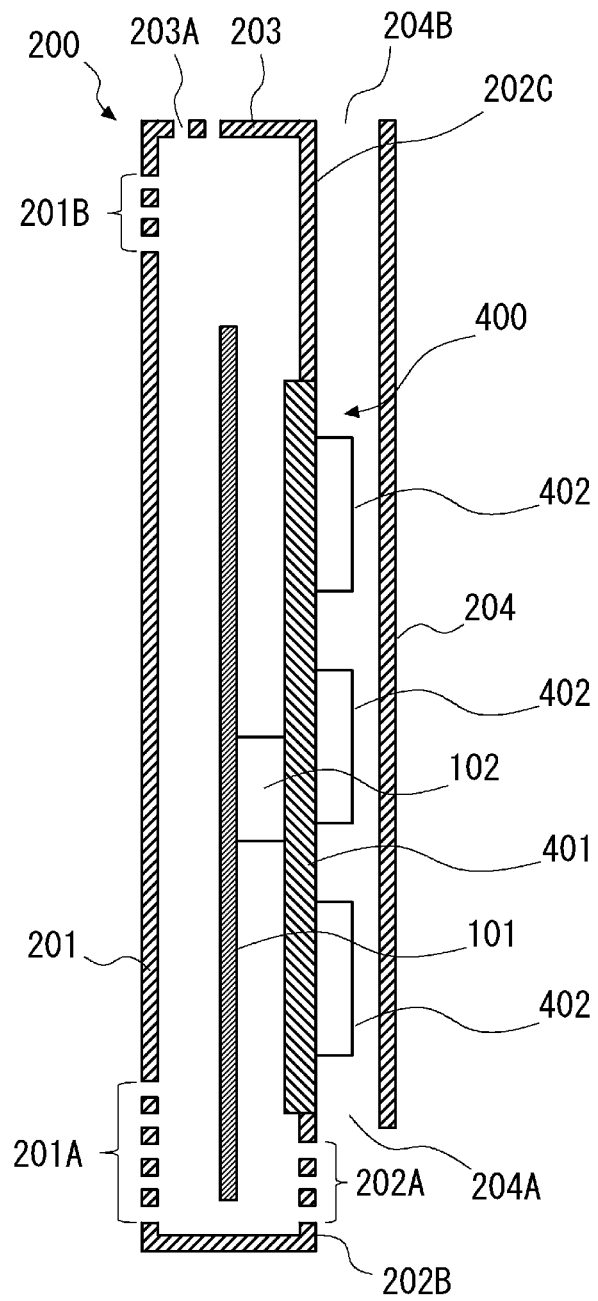
FIG. 12 is a cross-sectional view showing the casing according to the comparative example.
Figure 12:
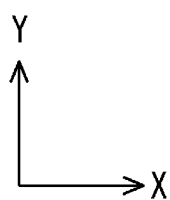

A casing 200 according to a comparative example is described hereinafter with reference to FIGS. 11 and 12. The casing 200 according to the comparative example is different from the casing 200 according to the second embodiment only in that it does not include the heat-dissipating waterproof structure 300. Thus, the same elements are denoted by the same reference symbols and the description thereof is omitted. FIG. 11 is a perspective view showing the casing 200 according to the comparative example. In FIG. 11, the casing 200 is partially cut, and the internal structure of the casing 200 is partially shown. FIG. 12 is a cross-sectional view showing the casing 200 according to the comparative example. Specifically, FIG. 12 is a cross-sectional view along line XII-XII in FIG. 11.

First, regarding the waterproofness, because the casing 200 according to the comparative example does not include the heat-dissipating waterproof structure 300, a liquid that enters into the casing 200 through the outlets 203A on the top part 203 directly reaches a region in which the substrate 101 and the heat source 102 exist in accordance with gravity.

Further, regarding the heat dissipation ability, high-temperature air concentrates in a region immediately above the heat source 102. Thus, while the parts of the casing 200 and the outlets located in the region immediately above the heat source 102 get hot, the parts of the casing 200 and the outlets located in the region away from the heat source 102 do not get hot. Therefore, high-temperature air is not likely to reach the region away from the heat source 102. In other words, it is not possible to diffuse high-temperature air as evenly as possible in the casing 200.

Third Embodiment

Figure 13:
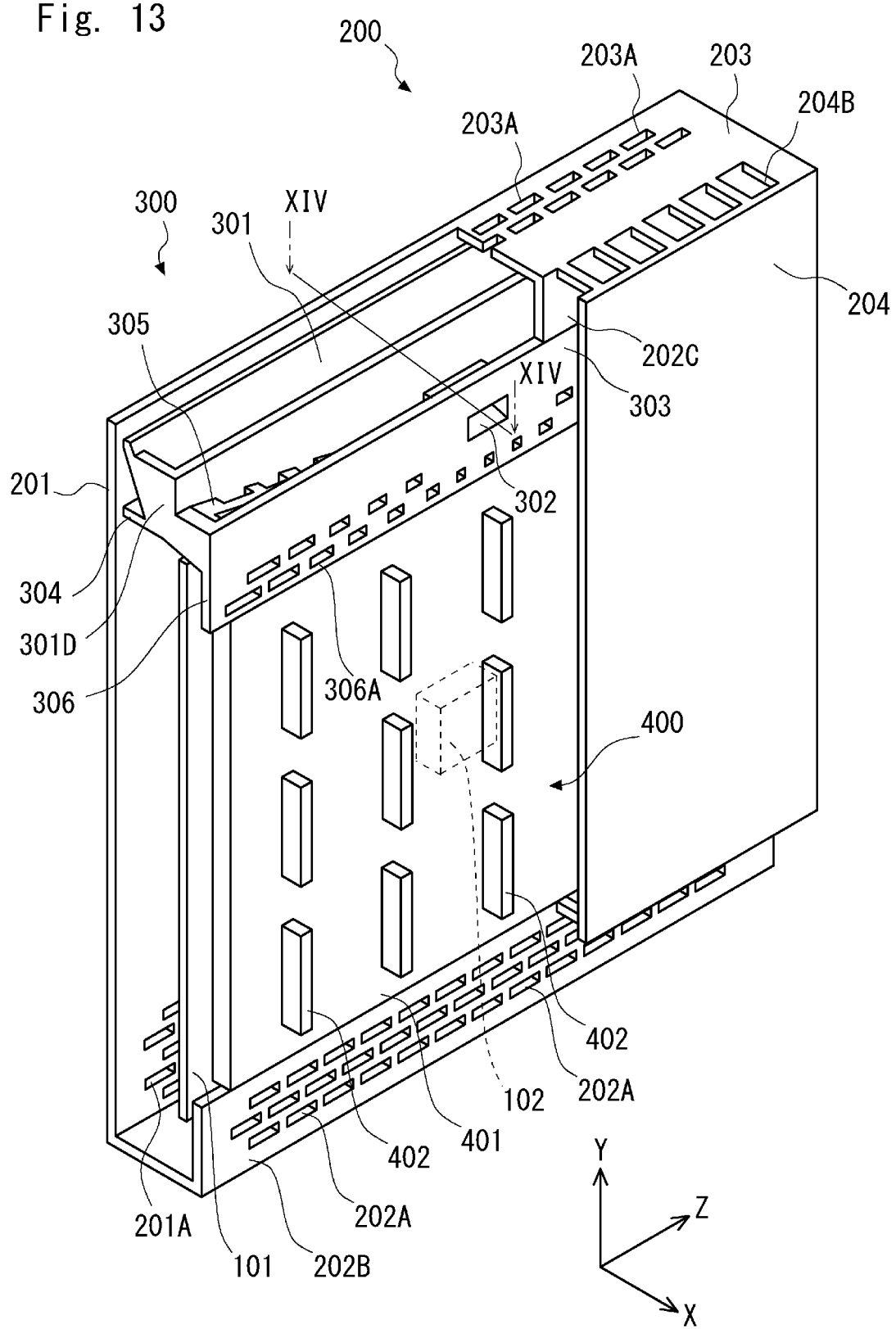
FIG. 13 is a perspective view showing a casing having a heat-dissipating waterproof structure according to a third embodiment.
Figure 14:
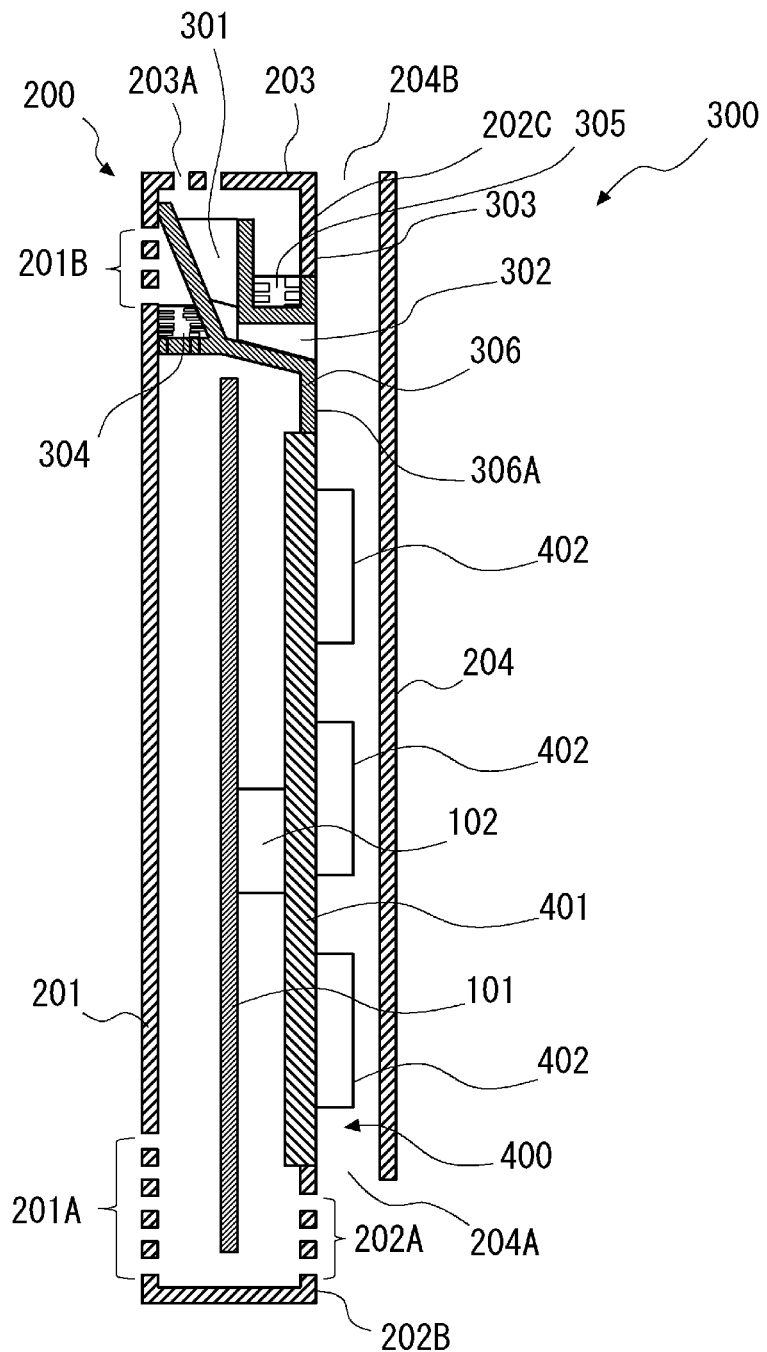
FIG. 14 is a cross-sectional view showing the casing having the heat-dissipating waterproof structure according to the third embodiment.
Figure 15:
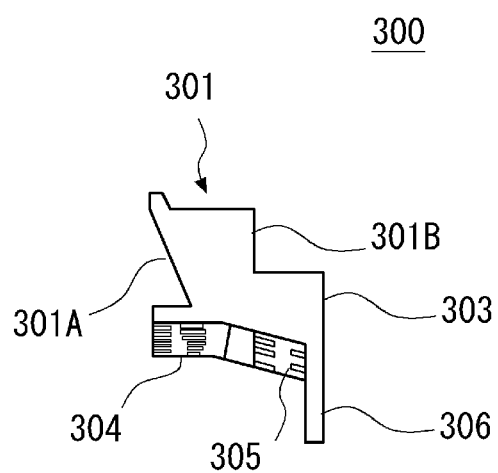
FIG. 15 is a front view showing the heat-dissipating waterproof structure according to the third embodiment.
Figure 16:
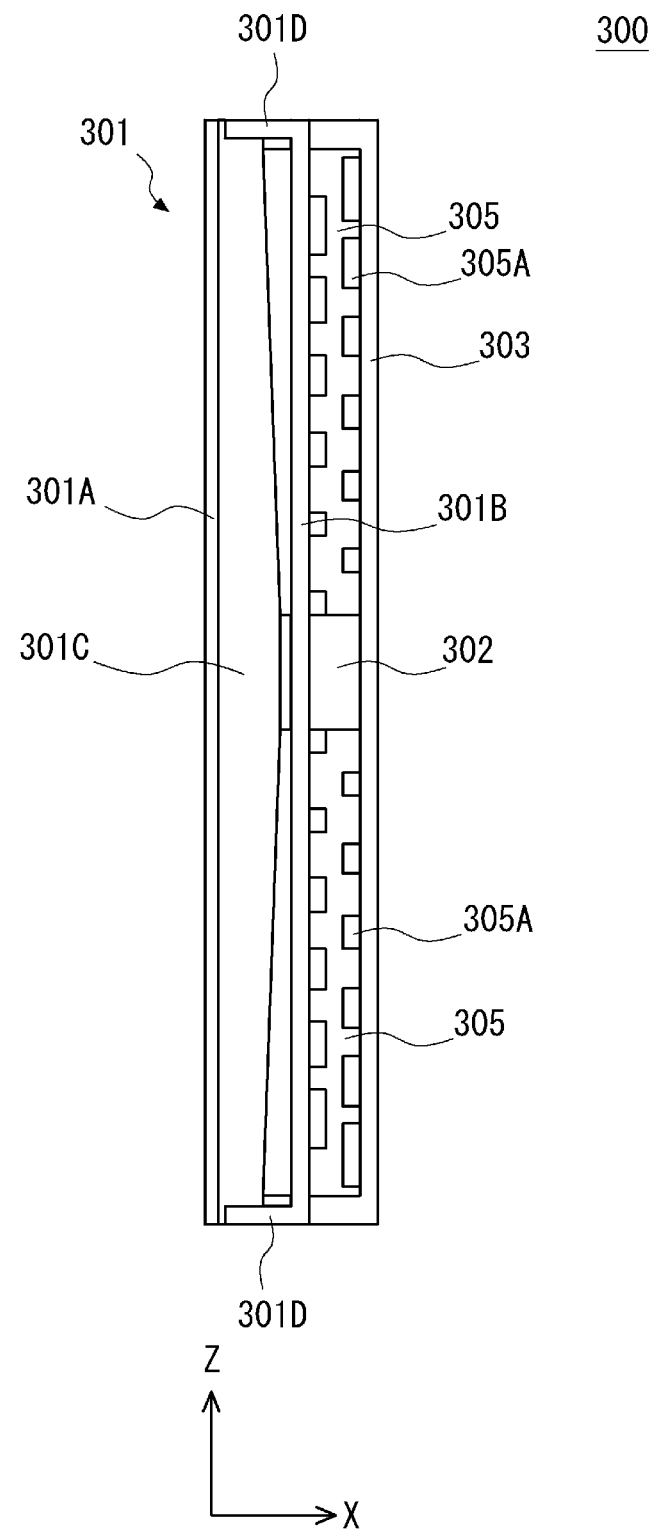
FIG. 16 is a plan view showing the heat-dissipating waterproof structure according to the third embodiment.
Figure 17:
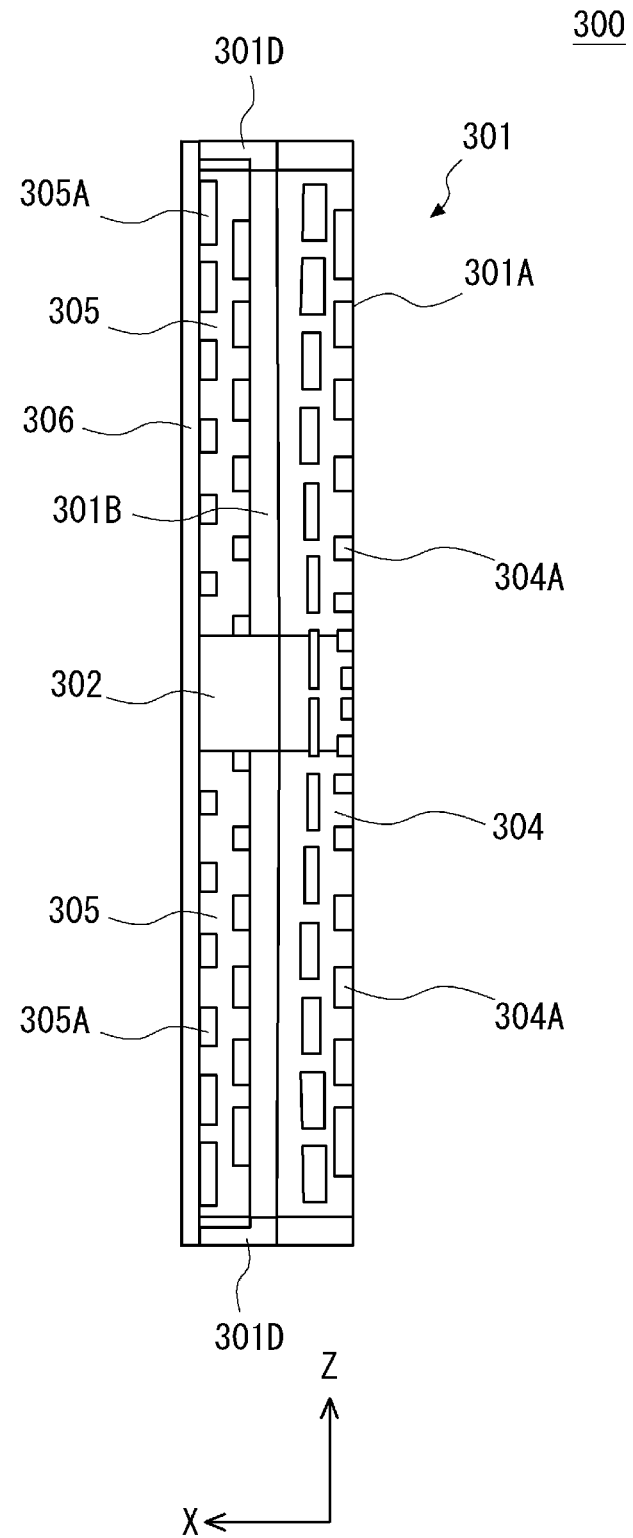
FIG. 17 is a bottom view showing the heat-dissipating waterproof structure according to the third embodiment.
Figure 18:
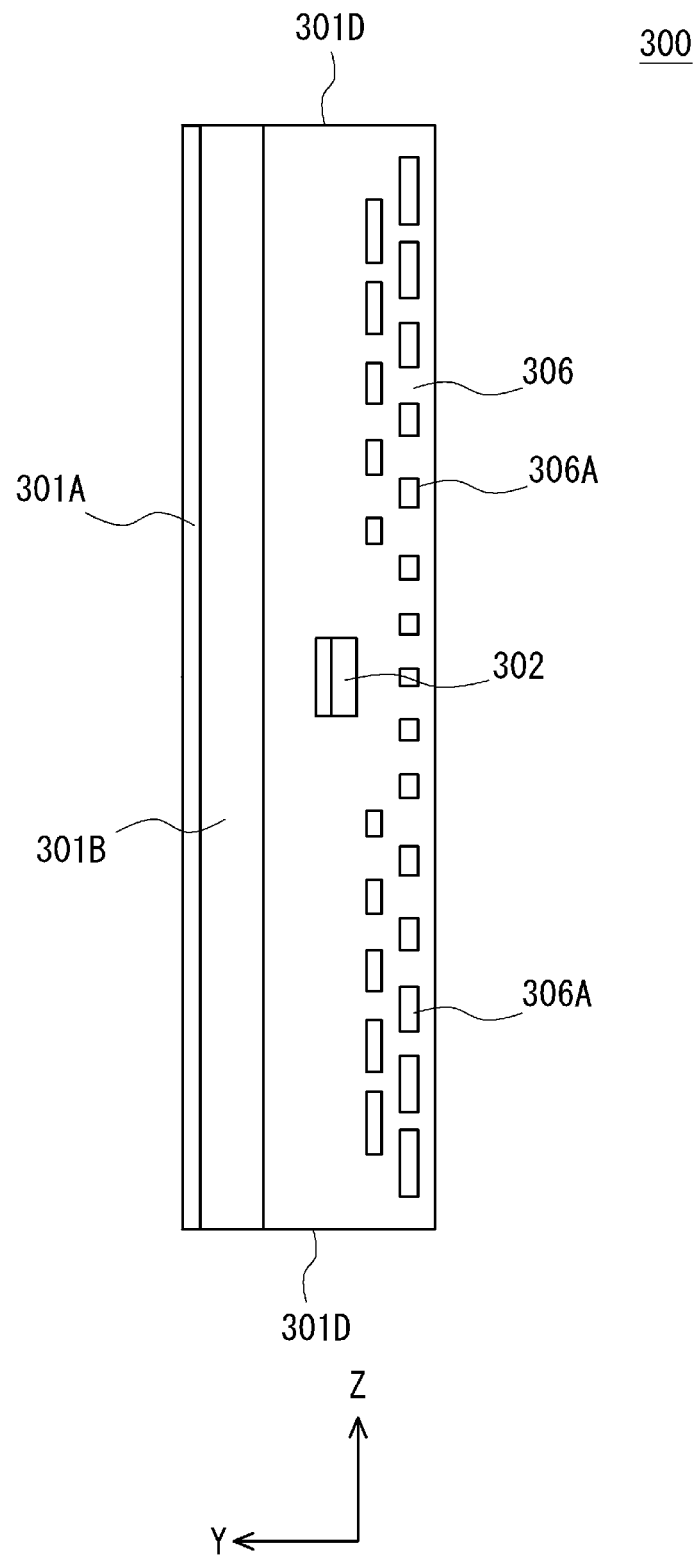
FIG. 18 is a side view showing the heat-dissipating waterproof structure according to the third embodiment.
Figure 19:
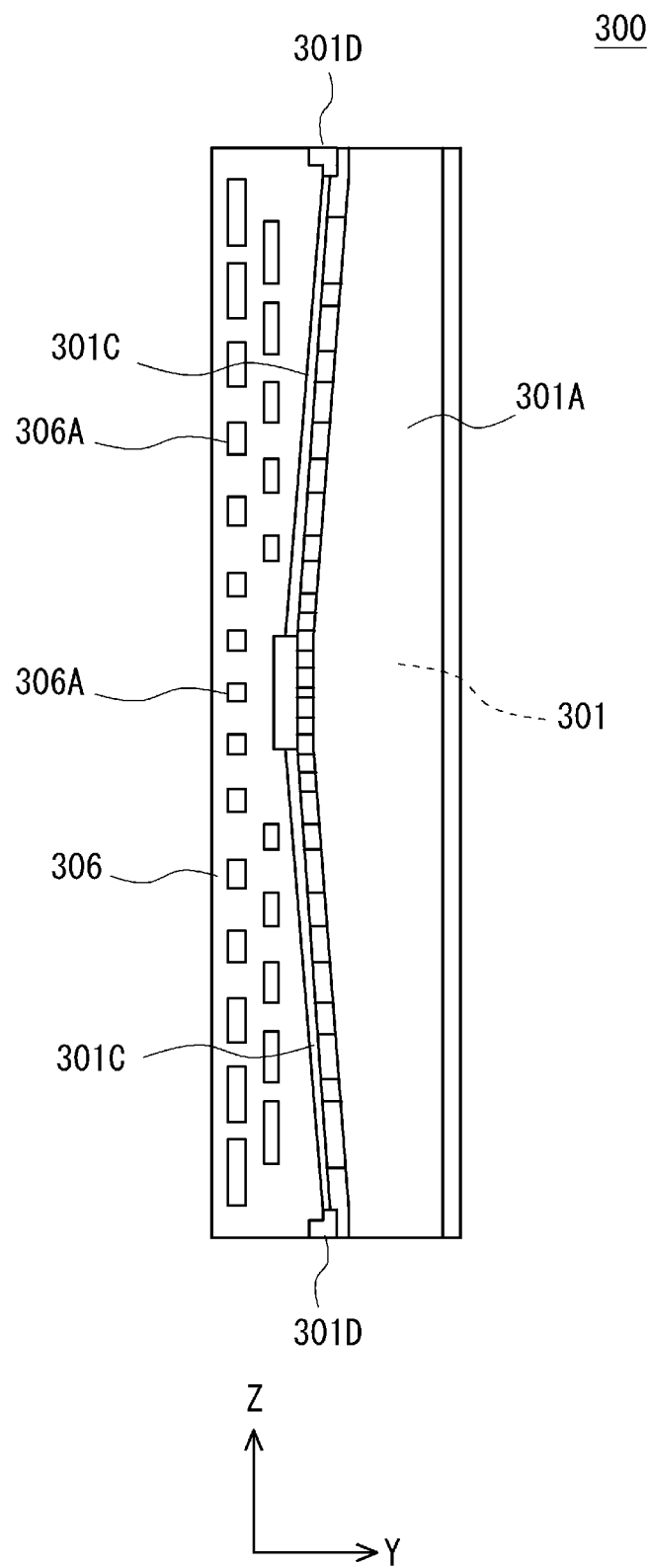
FIG. 19 is a side view showing the heat-dissipating waterproof structure according to the third embodiment.

A third embodiment of the present invention is described hereinafter with reference to FIGS. 13 to 19. FIG. 13 is a perspective view showing a casing 200 that includes a heat-dissipating waterproof structure 300 according to the third embodiment. In FIG. 13, the casing 200 is partially cut, and the internal structure of the casing 200 is partially shown. FIG. 14 is a cross-sectional view showing the casing 200 that includes the heat-dissipating waterproof structure 300 according to the third embodiment. Specifically, FIG. 14 is a cross-sectional view along line XIV-XIV in FIG. 13. FIG. 15 is a front view showing the heat-dissipating waterproof structure 300 according to the third embodiment. FIG. 16 is a plan view showing the heat-dissipating waterproof structure 300 according to the third embodiment. FIG. 17 is a bottom view showing the heat-dissipating waterproof structure 300 according to the third embodiment. FIG. 18 is a side view showing the heat-dissipating waterproof structure 300 according to the third embodiment. FIG. 19 is a side view showing the heat-dissipating waterproof structure 300 according to the third embodiment.

The heat-dissipating waterproof structure 300 according to the third embodiment is different from the heat-dissipating waterproof structure 300 according to the second embodiment in that it includes a first lattice part 304, a second lattice part 305, and a third lattice part 306. Thus, the same elements are denoted by the same reference symbols and the description thereof is omitted.

The first lattice part 304 is a plate-like member that extends from the bottom part 301C of the water receiving part 301 toward the side part 201 opposite the water guide channel 302.

Further, as shown in FIG. 17, the first lattice part 304 has a plurality of first through-holes 304A arranged in a lattice pattern. By appropriately adjusting the shape and size of each first through-hole 304A, the layout of the plurality of first through-holes 304A, the number of the first through-holes 304A provided in the first lattice part 304 and so on (which are referred to hereinafter as "lattice parameters"), it is possible to adjust the flow rate of air in an arbitrary area of the casing 200.

For example, in this third embodiment, the size of a certain first through-hole 304A is smaller than the size of another first through-hole 304A located on the outer side of this certain first through-hole 304A. In other words, the first through-hole 304A is small near the center of the first lattice part 304, and the first through-hole 304A becomes larger toward the ends along the length (the ends along the x-axis) of the first lattice part 304. Thus, the flow rate of air passing through the first through-hole 304A is lower near the center of the first lattice part 304, and the flow rate of air passing through the first through-hole 304A is higher toward the ends along the length (the ends along the x-axis) of the first lattice part 304. It is thereby possible to suppress the occurrence of a local high temperature region near the plurality of outlets 201B in the upper part of the side part 201.

The first lattice part 304 slopes gradually upward (to the positive side of the y-axis) from the position corresponding to the heat source 102 toward the ends along the length (the ends along the x-axis). In other words, the y-z cross section of the first lattice part 304 is substantially V-shaped. Thus, high-temperature air that has reached a part of the first lattice part 304 near the heat source 102 is guided to the end along the length of the first lattice part 304. This produces the flow of air that guides high-temperature air in a region near the heat source 102 to a region away from the heat source 102. It is thereby possible to suppress the occurrence of a local high temperature region in the casing 200 due to the location of the heat source 102 or the like.

Further, the first lattice part 304 can accept a liquid entering through the plurality of outlets 201B on the upper part of the side part 201 by a part different from the first through-hole 304A. Furthermore, the plurality of first through-holes 304A of the first lattice part 304 allow dispersion of a liquid entering below the first lattice part 304. By adjusting the lattice parameters of the first lattice part 304, it is possible to adjust the flow rate of a liquid entering below the first lattice part 304 for each region of the first lattice part 304. The optimum lattice parameters for the casing 200 may be set as appropriate in consideration of a balance between heat dissipation and water resistance. For example, by eliminating the first through-holes 304A near the center of the first lattice part 304 (the position corresponding to the heat source 102), it is possible to block the air flowing from near the center of the first lattice part 304 to the outlets 201B of the side part 201 and more reliably prevent a liquid from entering into an area where the heat source 102 is placed.

The second lattice part 305 is a plate-like member that is provided between the water receiving part 301 and the wall part 303.

Further, as shown in FIGS. 16 and 17, the second lattice part 305 has a plurality of second through-holes 305A arranged in a lattice pattern. Like the first through-holes 304A, it is possible to adjust the flow rate of air in an arbitrary area of the casing 200 by appropriately adjusting the lattice parameters of the second lattice part 305.

For example, in this third embodiment, the size of a certain second through-hole 305A is smaller than the size of another second through-hole 305A located on the outer side of this certain second through-hole 305A. In other words, the second through-hole 305A is small near the center of the second lattice part 305, and the second through-hole 305A becomes larger toward the ends along the length (the ends along the x-axis) of the second lattice part 305. Thus, the flow rate of air passing through the second through-hole 305A is lower near the center of the second lattice part 305, and the flow rate of air passing through the second through-hole 305A is higher toward the ends along the length (the ends along the x-axis) of the second lattice part 305. It is thereby possible to suppress the occurrence of a local high temperature region near the plurality of outlets 203A provided in the top part 203.

The second lattice part 305 slopes gradually upward from the position corresponding to the heat source 102 toward the ends along the length (the ends along the x-axis). In other words, the y-z cross section of the second lattice part 305 is substantially V-shaped. Thus, high-temperature air that has reached a part of the second lattice part 305 near the heat source 102 is guided to the end along the length of the second lattice part 305. This produces the flow of air that guides high-temperature air in a region near the heat source 102 to a region away from the heat source 102. It is thereby possible to suppress the occurrence of a local high temperature region in the casing 200 due to the location of the heat source 102 or the like.

The third lattice part 306 is provided at the lower end of the wall part 303. To be specific, the wall part 303 has a plurality of third through-holes 306A at its lower end, which is the third lattice part 306. Like the first lattice part 304 and the second lattice part 305, it is possible to adjust the flow rate of air in an arbitrary area of the casing 200 by appropriately adjusting the lattice parameters of the third lattice part 306.

For example, in this third embodiment, the size of a certain third through-hole 306A is smaller than the size of another third through-hole 306A located on the outer side of this certain third through-hole 306A. In other words, the third through-hole 306A is small near the center of the third lattice part 306, and the third through-hole 306A becomes larger toward the ends along the length (the ends along the x-axis) of the third lattice part 306. Thus, the flow rate of air passing through the third through-hole 306A is lower near the center of the third lattice part 306, and the flow rate of air passing through the third through-hole 306A is higher toward the ends along the length (the ends along the x-axis) of the third lattice part 306. It is thereby possible to suppress the occurrence of a local high temperature region near the outlets 204B in the chimney space.

In the heat-dissipating waterproof structure 300 according to the third embodiment described above, it is possible to adjust the flow rate of air in an arbitrary area of the casing 200 by adjusting the lattice parameters of the first lattice part 304, the second lattice part 305, and the third lattice part 306. It is thereby possible to suppress the occurrence of a local high temperature region in the casing 200 due to the location of the heat source 102 or the like.

Fourth Embodiment

Figure 20:
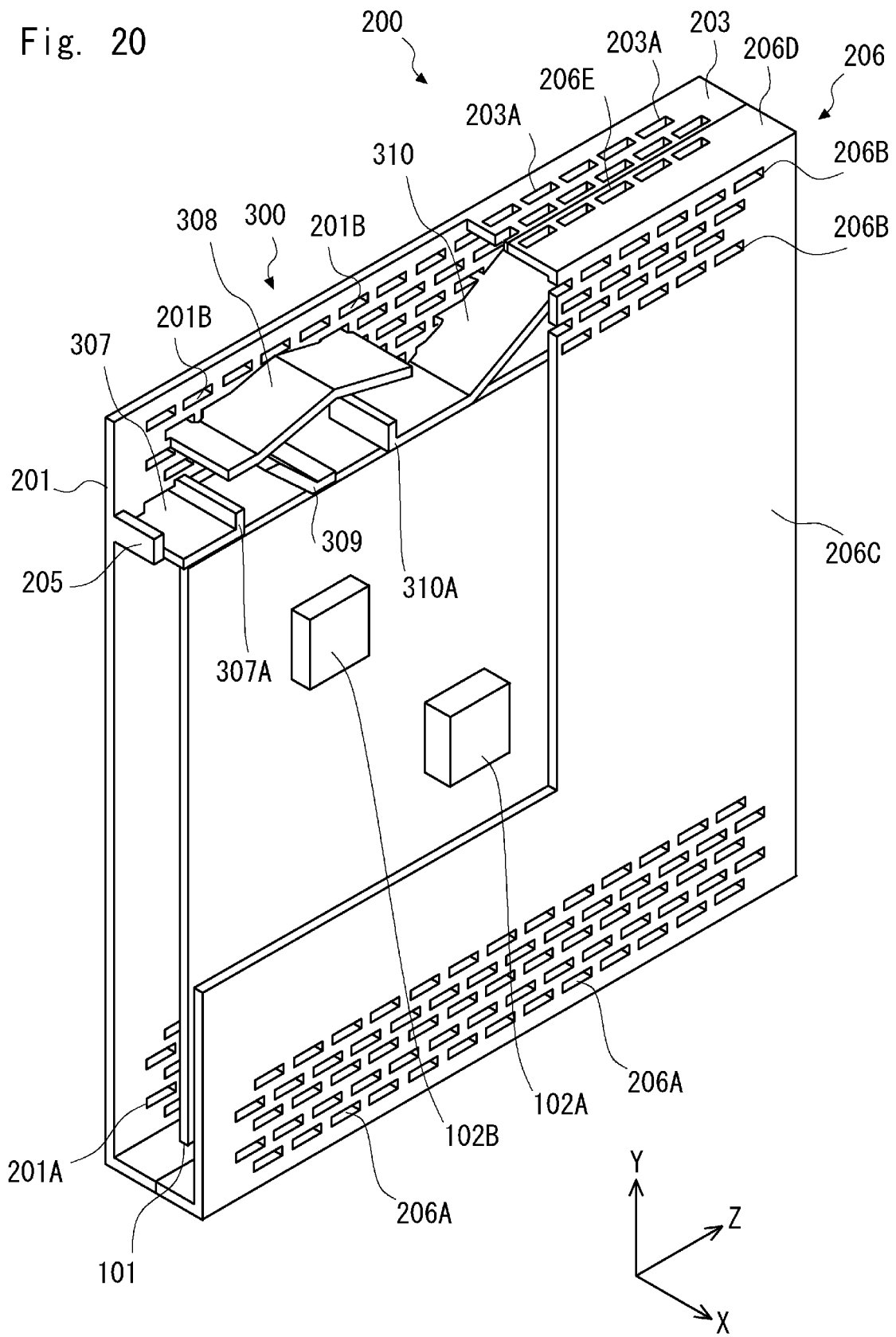
FIG. 20 is a perspective view showing a casing having a heat-dissipating waterproof structure according to a fourth embodiment.
Figure 21:
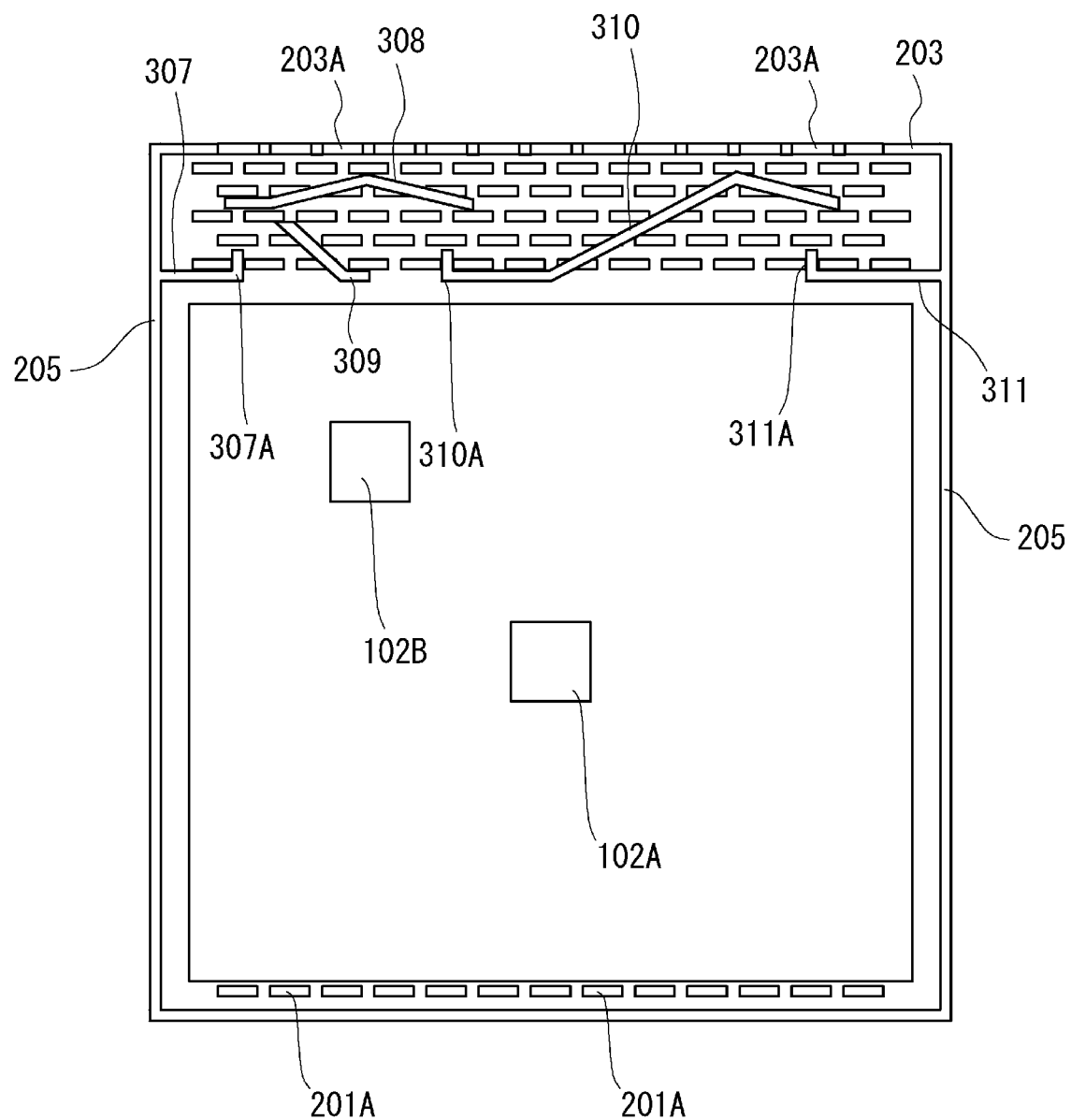
FIG. 21 is a cross-sectional view showing the casing having the heat-dissipating waterproof structure according to the fourth embodiment.

A fourth embodiment of the present invention is described hereinafter with reference to FIGS. 20 and 21. FIG. 20 is a perspective view showing a casing that includes a heat-dissipating waterproof structure 300 according to the fourth embodiment. In FIG. 20, the casing is partially cut, and the internal structure of the casing is partially shown. FIG. 21 is a cross-sectional view showing the casing that includes the heat-dissipating waterproof structure 300 according to the fourth embodiment. FIG. 21 shows the state where a second casing part 206 (which is described later) is removed.

As shown in FIGS. 20 and 21, the fourth embodiment is different from the second embodiment in that the side part 202, the side part 204 and the heatsink-like part 400 are eliminated. Further, the structure of the heat-dissipating waterproof structure 300 according to the fourth embodiment is different from the heat-dissipating waterproof structure 300 according to the second embodiment. In the fourth embodiment, the casing 200 from which the side part 202, the side part 204 and the heatsink-like part 400 are eliminated is a first casing part 200. The casing according to the fourth embodiment includes the first casing part 200 and the second casing part 206. Besides this, the structure of the fourth embodiment is the same as that of the second embodiment, and the same elements are denoted by the same reference symbols and the description thereof is omitted.

Although the chimney space created between the heatsink-like part 400 and the side part 204 is eliminated in the fourth embodiment, this chimney space may be provided. Further, the first casing part 200 and the second casing part 206 may be integrated together.

The first casing part 200 includes a bottom part, a side part 201 substantially parallel to the y-z plane, a top part 203, and two side parts 205 substantially parallel to the x-y plane. The side parts 205 are provided on the front side (the negative side of the z-axis) and the rear side (the positive side of the z-axis) of the side part 201 and the top part 203. The side parts 205 extend from the side part 201 to a side part 206C of the second casing part 206.

The second casing part 206 includes a bottom part, a side part 206C substantially parallel to the y-z plane, and a top part 206D. The side part 201 of the first casing part 200 and the side part 206C of the second casing part 206 are opposite each other. Further, the side part 206C has a plurality of inlets 206A in its lower part. The side part 206C also has a plurality of outlets 206B in its upper part. The top part 206D has a plurality of outlets 206E.

In the fourth embodiment, heat sources 102A and 102B are mounted on the surface of the substrate 101 closer to the side part 206C. The heat source 102A is placed on the positive side of the z-axis, and the heat source 102B is placed on the negative side of the z-axis. Further, the heat source 102A is placed lower (on the negative side of the y-axis) than the heat source 102B. In the fourth embodiment, however, the number and layout of heat sources accommodated in the casing are not limited thereto.

The heat-dissipating waterproof structure 300 according to the fourth embodiment is provided between the top parts 203 and 206D of the casing and the heat sources 102A and 102B. To be specific, the heat-dissipating waterproof structure 300 is provided in a region where the side part 201 has the outlets 201B. In other words, the heat-dissipating waterproof structure 300 is provided in a region where the side part 206C has the outlets 206B.

As shown in FIGS. 20 and 21, the heat-dissipating waterproof structure 300 includes ribs 307, 308, 309, 310 and 311. The ribs 307, 308, 309, 310 and 311 are plate-like members that have a width to come into tight contact with the two opposite side parts 201 and 206C and are provided substantially perpendicular to the side parts 201 and 206C. Note that the ribs 307, 308, 309, 310 and 311 may be integrated with the casing or may be separate parts from the casing.

The surface of the rib 307 is substantially horizontal (substantially parallel to the x-z plane). The end of the rib 307 on the negative side of the z-axis is joined to the side part 205 of the casing. The rib 307 has a wall 307A with a specified height, which is formed by bending the end of the rib 307 on the positive side of the z-axis upward. The upper surface of the rib 307 is substantially at the same height as the outlets 201B at the lowest position in the side part 201. Thus, the space above the rib 307 is connected to the outside of the space in which the heat sources 102A and 102B are accommodated through the outlets 201B and 206B in the upper part of the side parts 201 and 206C. The rib 307 receives a liquid having entered into the casing through the outlets 201B, 206B, 203A and 206E and a liquid dripped from the rib 308. The rib 307 then discharges the received liquid to the outside of the casing through the outlets 201B and 206B. In this manner, the rib 307 functions as a discharge part of the heat-dissipating waterproof structure 300. Note that the surface of the rib 307 may have any shape as long as it can store a liquid, and the y-z cross section of the rib 307 may be V-shaped, for example.

The rib 308 is placed immediately above the heat source 102B. Further, the rib 308 is placed upper than the rib 307. The y-z cross-section of the rib 308 has an inverted V shape with the apex at the top. Thus, the surface of the rib 308 is a sloping surface. The upper surface of the end of the rib 308 on the negative side of the z-axis is a substantially horizontal surface (surface substantially parallel to the x-z plane) that extends from the wall 307A of the rib 307 to the negative side of the z-axis. The end of the rib 308 on the positive side of the z-axis extends from a wall 310A (which is described later) of the rib 310 to the positive side of the z-axis. With this sloping surface, the rib 308 guides a liquid having entered into the casing through the outlet 203A of the top part 203, the outlet 206E of the top part 206D, the outlet 201B of the side part 201 and the outlet 206B of the side part 206C toward the rib 307 and the rib 310. Further, with this sloping surface, the rib 308 receives the air warmed by the heat source 102B and rising, and then divides and guides this air in the negative direction of the z-axis and the positive direction of the z-axis. In this manner, the rib 308 functions as a slope part of the heat-dissipating waterproof structure 300.

The rib 309 is placed immediately above the heat source 102B. Further, the rib 309 is placed lower than the rib 308. The lower surface of the rib 309 is a sloping surface that gradually becomes higher as it is away from immediately above the heat source 102B in the negative direction of the z-axis. The rib 309 thereby guides the air warmed by the heat source 102B and rising from immediately above the heat source 102B in the negative direction of the z-axis. In this manner, the rib 309 functions as a slope part of the heat-dissipating waterproof structure 300.

The rib 310 extends from immediately above the heat source 102A to the positive side of the z-axis. Immediately above the heat source 102, 102A the surface of the rib 310 is substantially horizontal. This horizontal part of the rib 310 is substantially at the same height as the outlets 201B at the lowest position on the side part 201. Thus, the space above the rib 310 is connected to the outside of the space in which the heat sources 102A and 102B are accommodated through the outlets 201B and 206B in the upper part of the side parts 201 and 206C. Further, the rib 310 has a wall 310A with a specified height, which is formed by bending the end of the rib 310 on the negative side of the z-axis upward. On the positive side of the z-axis of immediately above the heat source 102A, the y-z cross-section of the rib 310 has an inverted V shape with the apex at the top. Thus, the surface of the rib 310 is a sloping surface. The end of the rib 310 on the positive side of the z-axis extends from a wall 311A (which is described later) of the rib 311 to the positive side of the z-axis. With this sloping surface, the rib 310 guides a liquid having entered into the casing through the outlet 203A of the top part 203, the outlet 206E of the top part 206D, the outlet 201B of the side part 201 and the outlet 206B of the side part 206C toward the horizontal part of the rib 310 and the rib 311. Further, this sloping surface of the rib 310 guides the air warmed by the heat source 102A and rising from immediately above the heat source 102A in the positive direction of the z-axis. In this manner, the rib 310 functions as a slope part of the heat-dissipating waterproof structure 300. The horizontal part of the rib 310 receives a liquid having entered into the casing through the outlets 201B, 206B, 203A and 206E, a liquid dripped from the rib 308, and a liquid having been guided by the sloping surface of the rib 310. The rib 310 then discharges the received liquid to the outside of the casing through the outlets 201B and 206B. In this manner, the rib 310 functions as a discharge part of the heat-dissipating waterproof structure 300. Note that the horizontal part of the rib 310 may have any shape as long as it can store a liquid, and the shape of the horizontal part of the rib 310 may be changed to the shape where the y-z cross section is V-shaped, for example.

The surface of the rib 311 is substantially horizontal. Further, the end of the rib 311 on the positive side of the z-axis is joined to the side part 205 of the casing. The rib 311 has a wall 311A with a specified height, which is formed by bending the end of the rib 311 on the negative side of the z-axis upward. The upper surface of the rib 311 is substantially at the same height as the outlets 201B at the lowest position in the side part 201. Thus, the space above the rib 311 is connected to the outside of the space in which the heat sources 102A and 102B are accommodated through the outlets 201B and 206B in the upper part of the side parts 201 and 206C. The rib 311 receives a liquid having entered into the casing through the outlets 201B, 206B, 203A and 206E and a liquid dripped from the rib 310. The rib 311 then discharges the received liquid to the outside of the casing through the outlets 201B and 206B. In this manner, the rib 311 functions as a discharge part of the heat-dissipating waterproof structure 300. Note that the surface of the rib 311 may have any shape as long as it can store a liquid, and the y-z cross section of the rib 311 may be V-shaped, for example.

In the heat-dissipating waterproof structure 300 according to the fourth embodiment described above, the ribs 308 and 310, which serve as the slope part, guides a liquid that has entered into the casing through the outlet 203A of the top part 203, the outlet 206E of the top part 206D, the outlet 201B of the side part 201 and the outlet 206B of the side part 206C toward the horizontal part of the ribs 307 and 310 and the rib 311, which serve as the discharge part. Further, the horizontal part of the ribs 307 and 310 and the rib 311, which serve as the discharge part, discharge this liquid to the outside of the space in which the heat source 102A and 102B is accommodated through the outlets 201B and 206B.

Further, the lower surface of the rib 309 is a sloping surface that gradually becomes higher as it is away from immediately above the heat source 102B in the negative direction of the z-axis. The rib 309 thereby guides the air warmed by the heat source 102B and rising from immediately above the heat source 102B in the negative direction of the z-axis. Further, the lower surface of the rib 308 is a sloping surface that gradually becomes lower as it is away from immediately above the heat source 102B along the z-axis direction. The rib 308 thereby receives the air warmed by the heat source 102B and rising, and then divides and guides this air in the negative direction of the z-axis and the positive direction of the z-axis. Furthermore, on the positive side of the z-axis of immediately above the heat source 102A, the y-z cross-section of the rib 310 has an inverted V shape with the apex at the top. It is thereby possible to guide the air warmed by the heat source 102A and rising from immediately above the heat source 102A in the positive direction of the z-axis. Therefore, the ribs 308, 309 and 310 serve as a duct and allow the temperature of the air in the upper part in the casing to be equalized to some extent, which suppresses the occurrence of a local high temperature region in the casing due to the location of the heat sources 102A and 1028 or the like. It is thereby possible to provide the heat-dissipating waterproof structure 300 having both excellent heat dissipation ability and high waterproofness.

Further, by adjusting the size, number, layout and so on of the outlets 201B and 206B that allow the rib 307, the horizontal part of the rib 310 and the rib 311 to communicate with the outside of the casing as appropriate just like the lattice parameters in the third embodiment, it is possible to adjust the flow rate of air in an arbitrary area in the upper part of the casing, which suppresses the occurrence of a local high temperature region and equalize the temperature of the surface of the casing.

It should be noted that the present invention is not limited to the above-described embodiments and may be varied in many ways within the scope of the present invention.

For example, the applicable direction of the present invention is not limited to those described in the embodiments. It is applicable to a plurality of arbitrary directions in the installations that are acceptable in the specification of the casing. Note that, however, it is necessary to give consideration to the sloping direction or the like of each component so that the structure that exerts the effects of the present invention when the casing is installed in a certain direction does not cause deterioration of the effects when this casing is installed in a different direction.

Further, the sloping shape of the slope part according to the present invention is not limited to the shapes described in the above embodiments. For example, in the second embodiment, the y-z cross section of the bottom part 301C of the water receiving part 301 may be an inverted V-shape. In this case, the water guide channel 302 can be provided at both ends of the water receiving part 301. Further, the high-temperature air that has reached the apex of the V shape of the water receiving part 301 can be guided from this apex to the end of the water receiving part 301.

Furthermore, the shape, layout, and number of the ribs 307, 308, 309, 310 and 311 described in the fourth embodiment may be also varied as appropriate depending on the number and positions of the heat sources 102 accommodated in the casing.

For example, although the ribs 307, 308, 309, 310 and 311 are placed on the first casing part 200 in the fourth embodiment, the ribs 307, 308, 309, 310 and 311 may be placed on the second casing part 206.

Further, the ribs do not necessarily have a width to come into tight contact with the two opposite side parts 201 and 206C, as long as they extend from one of the two opposite side parts 201 and 206C to the other one. In other words, the ribs that extend from the side part 201 toward the side part 206C are not necessarily in tight contact with the side part 206C. Likewise, the ribs that extend from the side part 206C toward the side part 201 are not necessarily in tight contact with the side part 201. The width (the length in the x-axis direction) of the ribs is not limited as long as it has a length that can receive a liquid entering through the outlets 201B and 206B and a liquid entering through the outlets 203A and 206E.

Further, a certain rib may extend from the side part 201 toward the side part 206C and another rib may extend from the side part 206C toward the side part 201. For example, this certain rib and the other rib may be placed at the same positions on the y-z plane. In this case, if the end of the certain rib on the positive side of the x-axis and the end of the other rib on the negative side of the x-axis are in tight contact with each other, the waterproofness of the heat-dissipating waterproof structure 300 can be achieved more reliably. Further, the ribs may extend alternately in the height direction (y-axis direction) from the two opposite side parts 201 and 206C. Specifically, when a certain rib extends from the side part 201 toward the side part 206C, another rib that is next to this certain rib in the height direction (y-axis direction) may extend from the side part 206C toward the side part 201. In this case, if the certain rib and the other rib have widths overlapping in the x-axis direction, the waterproofness of the heat-dissipating waterproof structure 300 can be achieved more reliably.

Further, both of the ribs extending from the side part 201 toward the side part 206C and the ribs extending from the side part 206C toward the side part 201 may have outlets serving as exhaust ports so as to discharge a liquid entering into the casing in a dispersed manner.

The ribs extending from the side part 201 toward the side part 206C may slope gradually downward as they get closer to the outlets 201B. Likewise, the ribs extending from the side part 206C toward the side part 201 may slope gradually downward as they get closer to the outlets 206B. It is thereby possible to more effectively discharge a liquid existing on the ribs through the outlets 201B and 206B and prevent the liquid on the ribs from dropping into the space in which the heat source is accommodated. It is difficult to form such ribs integrally with the casing, and the ribs may be formed as separate parts from the casing.

The wall 307A of the rib 307, the wall 310A of the rib 310 and the wall 311A of the rib 311 may be omitted. Even without the walls 307A, 310A and 311A, a liquid can be discharged to the outside of the casing through the outlets 201B and 206B to some extent.

A liquid may be discharged not only to the chimney space or the outside of the casing, and it may be discharged to a pool, an absorbent and so on placed inside the casing. A liquid may be discharged to any appropriate place in accordance with the specification or internal parts of a device. Note that the pool may have a bottom surface with a V-shaped cross section, so that high-temperature air reaches the lower surface of the apex of the V shape, for example, which promotes evaporation of a liquid in the pool. The absorbent may be an object with high water absorption such as a sponge, so that temporarily water absorption and evaporation of a liquid are done.

Further, the positions and number of components corresponding to the discharge part in the present invention are not limited to those described in the embodiments.

Further, the shape of the inlets and the outlets described in the embodiments is not limited to a rectangle, and it may be various shapes such as a triangle, a polygonal circle and so on. Further, the shape, number, positions and so on of the inlets and the outlets described in the embodiments may be adjusted as appropriate just like the lattice parameters.

Although a gas in the casing is evenly spread to prevent the occurrence of a local high temperature region in the above-described embodiments, the shape and layout of the slope part and the discharge part according to the present invention may be adjusted appropriately so that a high-temperature region or a low-temperature region is generated locally in a desired place of the casing. For example, the shape and layout of the slope part and the discharge part may be adjusted appropriately so that a high-temperature region is generated locally in an arbitrary region of the casing where there is no possibility of contact with a human body. Further, the shape and layout of the slope part and the discharge part may be adjusted appropriately so that a low-temperature region is generated locally in a desired region of the casing.

The shape and layout of the slope part and the discharge part according to the present invention may be determined in relation to rising air. Note that, however, it is necessary that the shape and layout of the slope part and the discharge part do not contribute to entry of a dripping liquid.

While the invention has been particularly shown and described with reference to example embodiments thereof, the invention is not limited to these example embodiments. It will be understood by those of ordinary skill in the art that various changes in form and details may be made therein without departing from the spirit and scope of the present invention as defined by the claims.

This application is based upon and claims the benefit of priority from Japanese patent application No. 2018-015630 filed on Jan. 31, 2018, the disclosure of which is incorporated herein in its entirety by reference.

REFERENCE SIGNS LIST

101 SUBSTRATE
102, 102A, 102B HEAT SOURCE
200 CASING, FIRST CASING
201 SIDE PART
201A INLET
201B OUTLET
202, 202B, 202C SIDE PART
202A INLET
203 TOP PART
203A OUTLET
204 SIDE PART
204A INLET
204B OUTLET
205 SIDE PART
206 SECOND CASING
206A INLET
206B OUTLET
206C SIDE PART
206D TOP PART
206E OUTLET
300 HEAT-DISSIPATING WATERPROOF STRUCTURE

301 WATER RECEIVING PART (SLOPE PART)
301A SIDE PART
301B SIDE PART
301C BOTTOM PART
301D SIDE PART
302 WATER GUIDE CHANNEL (DISCHARGE PART)
303 WALL PART
304 FIRST LATTICE PART
304A FIRST THROUGH-HOLE
305 SECOND LATTICE PART
305A SECOND THROUGH-HOLE
306 THIRD LATTICE PART
306A THIRD THROUGH-HOLE
307 RIB (DISCHARGE PART)
308 RIB (SLOPE PART)
309 RIB (SLOPE PART)
310 RIB (SLOPE PART, DISCHARGE PART)
311 RIB (DISCHARGE PART)

What is claimed is:

1. A heat-dissipating waterproof structure provided between a heat source and a top part of a casing to accommodate a heat source and the heat source, comprising:
    a slope part that guides a liquid having entered into the casing through an outlet provided in at least one of an upper part of a side part of the casing and the top part; and
    a discharge part that guides the liquid having as has been guided by the slope part to be discharged to outside of a space where the heat source is accommodated, wherein
    the slope part has at least a sloping surface which that gradually becomes higher with increasing distance from being immediately above the heat source,
    the slope part is a container capable of temporarily storing a predetermined amount of the liquid,
    a bottom surface of the container is the sloping surface, and
    the discharge part is a flow path connecting the slope part with the outside of the space where the heat source is accommodated at a lowest part of the sloping surface.

2. The heat-dissipating waterproof structure according to claim 1, wherein
    the heat-dissipating waterproof structure includes a first lattice part extending from the bottom surface of the slope part, toward opposite the discharge part, and toward the side part of the casing, and
    the first lattice part slopes upward from a position corresponding to the heat source toward an end of the first lattice part along a lengthwise direction of the first lattice part.

3. The heat-dissipating waterproof structure according to claim 2, wherein
    the first lattice part has a plurality of first through-holes arranged in a lattice pattern, and
    a size of a certain one of the first through-holes is smaller than a size of another one of the first through-holes located on an outer side of the certain one of the first through-holes.

4. The heat-dissipating waterproof structure according to claim 1, wherein
    the heat-dissipating waterproof structure includes a second lattice part provided between the slope part and a wall part positioned on a discharge part side of the slope part, and
    the second lattice part slopes upward from a position corresponding to the heat source toward an end of the second lattice part along a lengthwise direction of the second lattice part.

5. The heat-dissipating waterproof structure according to claim 4, wherein
    the second lattice part has a plurality of second through-holes arranged in a lattice pattern, and
    a size of a certain one of the second through-holes is smaller than a size of another one of the second through-holes located on an outer side of the certain one of the second through-holes.

6. The heat-dissipating waterproof structure according to claim 1, wherein
    the casing includes a heatsink-like part in which a plurality of fins stand on a plate,
    the heatsink-like part is placed so as to face another side part opposite the side part of the casing,
    the heat-dissipating waterproof structure includes a third lattice part extending downward to an upper end of the heatsink-like part, on an exit side of the discharge part,
    the third lattice part has a plurality of third through-holes arranged in a lattice pattern, and
    a size of a certain one of the third through-holes is smaller than a size of another one of the third through-holes located on an outer side of the certain one of the third through-holes.

* * * * *